US012740228B2

(12) United States Patent
Lee et al.

(10) Patent No.: US 12,740,228 B2
(45) Date of Patent: Sep. 15, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Munjae Lee, Wuhan (CN); Yu Gu, Wuhan (CN); Juewen Zhao, Wuhan (CN); Kailong Wu, Wuhan (CN); Zhao Li, Wuhan (CN); Junyuan Wang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 295 days.

(21) Appl. No.: 18/687,805

(22) PCT Filed: Dec. 21, 2023

(86) PCT No.: PCT/CN2023/140601

§ 371 (c)(1),
(2) Date: Feb. 28, 2024

(87) PCT Pub. No.: WO2025/123395

PCT Pub. Date: Jun. 19, 2025

(65) Prior Publication Data

US 2025/0248205 A1 Jul. 31, 2025

(30) Foreign Application Priority Data

Dec. 13, 2023 (CN) ......................... 202311715897.1

(51) Int. Cl.
*H10K 50/13* (2023.01)

(52) U.S. Cl.
CPC .................................. *H10K 50/131* (2023.02)

(58) Field of Classification Search
CPC .... H10K 2101/30; H10K 50/00; H10K 50/13; H10K 50/131; H10K 50/155; H10K 50/165; H10K 59/12
See application file for complete search history.

(56) References Cited

U.S. PATENT DOCUMENTS

2006/0220534 A1* 10/2006 Shibanuma ............ H10K 50/16 313/504
2021/0313355 A1* 10/2021 Yamazaki ............ H10D 86/481

FOREIGN PATENT DOCUMENTS

CN 102683603 A 9/2012
CN 110379931 A 10/2019

(Continued)

OTHER PUBLICATIONS

International Search Report in International application No. PCT/CN2023/140601, mailed on Aug. 30, 2024.

(Continued)

*Primary Examiner* — Jaehwan Oh
(74) *Attorney, Agent, or Firm* — PV IP PC; Peter Stechler; Wei Te Chung

(57) ABSTRACT

The present application provides a display panel and a display device. A light-emitting device layer includes an n-type charge generation layer and a p-type charge generation layer. The light-emitting device layer has a first operating voltage to operate at a preset current density, and has a second operating voltage after operating at the preset current density and a first preset temperature for a preset time. The absolute value of a difference value between the first operating voltage and the second operating voltage is a1, a1 is less than or equal to 1V. The first preset temperature is greater than or equal to 50° C.

20 Claims, 5 Drawing Sheets

(56) References Cited

FOREIGN PATENT DOCUMENTS

| | | | |
|---|---|---|---|
| CN | 112614948 | A | 4/2021 |
| CN | 115802787 | A | 3/2023 |
| JP | 2006351398 | A | 12/2006 |

OTHER PUBLICATIONS

Written Opinion of the International Search Authority in International application No. PCT/CN2023/140601,mailed on Aug. 30, 2024.

* cited by examiner

DISPLAY PANEL AND DISPLAY DEVICE

CROSS REFERENCE TO RELATED APPLICATION

This application claims the priority of International Application No. PCT/CN2023/140601, filed on 2023 Dec. 21, which claims priority to Chinese Application No. 202311715897.1, filed on 2023 Dec. 13. The entire disclosures of each of the above applications are incorporated herein by reference.

TECHNICAL FIELD

The present application relates to the field of display technologies, and especially relates to a display panel and a display device.

BACKGROUND

Compared with inorganic semiconductor materials, organic semiconductor materials have lower preparation cost, good controllability, and excellent optoelectronic properties, so an organic light-emitting diode (OLED) has great potential for application in optoelectronic devices of displays, lightings, and etc.

With development of flat display technologies, customers' requirements for stability of displays have gradually increased. In recent years, OLED displays have developed rapidly around the world, and OLED display technologies have become increasingly sophisticated. With improvements of OLED technologies and processes, application fields of the OLED displays are gradually expanding to medium and large sizes. In the field of medium and large-sized OLED displays, stability of the display is required to be higher, especially in terms of lifespan and temperature stability.

Although OLED devices have great advantages in terms of efficiency and lifespan, the OLED devices have an obvious problem of heat dissipation in a form of module that compresses the product in a stacked manner due to medium and large size products generate serious heat. If high-temperature stability of the OLED devices is insufficient, it is very easy to cause the display effect of the displays to be unstable and poor.

SUMMARY

Embodiments of the present application provide a display panel and a display device to improve high-temperature stability of a light-emitting device layer, and to improve display stability and display effect of the display panel.

An embodiment of the present application provides a display panel. The display panel includes a light-emitting device layer, and the light-emitting device layer includes:

- an anode;
- a first light-emitting layer disposed on a side of the anode;
- an n-type charge generation layer disposed on a side of the first light-emitting layer away from the anode and including an electron transport material and an n-type doping material;
- a p-type charge generation layer disposed on a side of the n-type charge generation layer away from the first light-emitting layer and including a hole transport material and a p-type doping material;
- a second light-emitting layer disposed on a side of the p-type charge generation layer away from the n-type charge generation layer; and
- a cathode disposed on a side of the second light-emitting layer away from the p-type charge generation layer;
- the light-emitting device layer has a first operating voltage to operate at a preset current density, and has a second operating voltage after operating at the preset current density and a first preset temperature for a preset time. The absolute value of a difference value between the first operating voltage and the second operating voltage is a1, a1 is less than or equal to 1V, and the first preset temperature is greater than or equal to 50° C.

According to the above object of the present application, an embodiment of the present application further provide a display device. The display device includes a display panel, the display panel includes a light-emitting device layer. The light-emitting device layer includes:

- an anode;
- a first light-emitting layer disposed on a side of the anode;
- an n-type charge generation layer disposed on a side of the first light-emitting layer away from the anode and including an electron transport material and an n-type doping material;
- a p-type charge generation layer disposed on a side of the n-type charge generation layer away from the first light-emitting layer and including a hole transport material and a p-type doping material;
- a second light-emitting layer disposed on a side of the p-type charge generation layer away from the n-type charge generation layer; and
- a cathode disposed on a side of the second light-emitting layer away from the p-type charge generation layer;
- the light-emitting device layer has a first operating voltage to operate at a preset current density, and has a second operating voltage after operating at the preset current density and a first preset temperature for a preset time. The absolute value of a difference value between the first operating voltage and the second operating voltage is a1, a1 is less than or equal to 1V, and the first preset temperature is greater than or equal to 50° C.

Beneficial effects of the present application, in the display panel provided by the present application, after the light-emitting device layer operates at a high temperature greater than or equal to 50° C. and the preset current density for the preset time, the absolute value of the difference value between the second operating voltage and the first operating voltage at the preset current density is less than or equal to 1V, so as to enable the light-emitting device layer to have better stability at the high temperature, thereby improving stability and display effect of the display panel.

DETAILED DESCRIPTION OF THE EMBODIMENT

The technical solutions in the embodiments of the present application are clearly and completely described below in conjunction with the drawings in the embodiments of the present application. Obviously, the embodiments described are only a part of the embodiments of the present application, rather than all the embodiments. Based on the embodiments in the present application, all other embodiments obtained by those skilled in the art without creative works should be deemed as falling within the claims of the present application.

The following disclosure provides many different embodiments or examples for implementing various structures of the present application. To simplify disclosure of the present application, components and arrangements of specific examples are described below. Of course, these are merely examples and are not intended to limit the present application. Furthermore, the present application may repeat reference numbers and/or reference letters in different examples, such repetition is for purposes of simplicity and clarity and does not indicate a relationship between various embodiments and/or arrangements discussed. In addition, the present application provides examples of various specific processes and materials, but one of ordinary skill in the art can recognize application of other processes and/or use of other materials.

Figure 1:
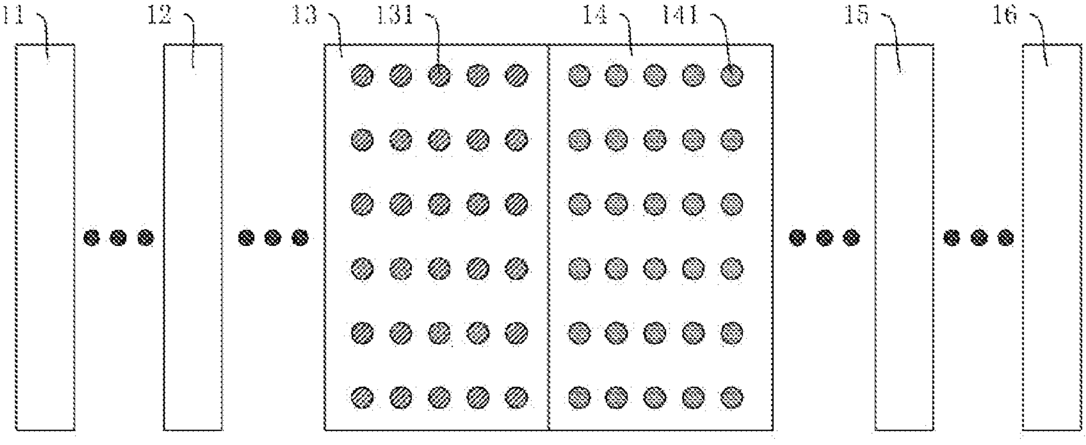
FIG. 1 is a schematic structural diagram of a light-emitting device layer in a display panel provided by an embodiment of the present application.
Figure 2:
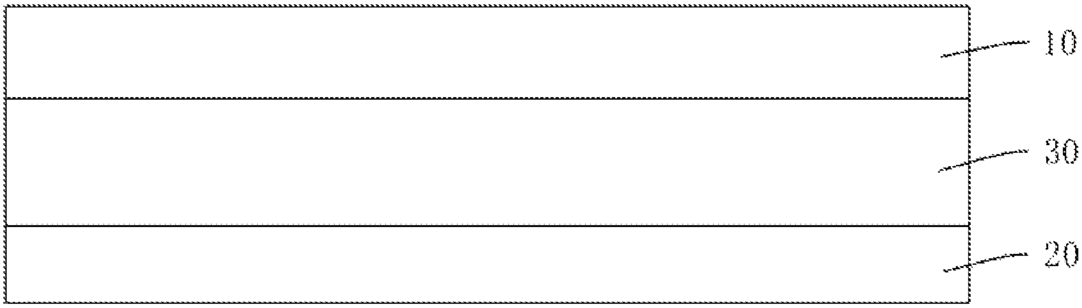
FIG. 2 is a schematic structural diagram of a display panel provided by an embodiment of the present application.

Please combine FIG. 1 and FIG. 2. A display panel provided by an embodiment of the present application includes a light-emitting device layer 10. The light-emitting device layer 10 includes an anode 11, a first light-emitting layer 12, an n-type charge generation layer 13, a p-type charge generation layer 14, a second light-emitting layer 15, and a cathode 16.

The first light-emitting layer 12 is disposed on a side of the anode 11. The n-type charge generation layer 13 is disposed on a side of the first light-emitting layer 12 away from the anode 11. The n-type charge generation layer 13 includes an electron transport material and an n-type doping material 131. The p-type charge generation layer 14 is disposed on a side of the n-type charge generation layer 13 away from the first light-emitting layer 12. The p-type charge generation layer 14 includes a hole transport material and a p-type doping material 141. The second light-emitting layer 15 is disposed on a side of the p-type charge generation layer 14 away from the n-type charge generation layer 13. The cathode 16 is disposed on a side of the second light-emitting layer 15 away from the p-type charge generation layer 14.

Further, the light-emitting device layer 10 has a first operating voltage to operate at a preset current density, and has a second operating voltage after operating at the preset current density and a first preset temperature for a preset time. The absolute value of a difference value between the first operating voltage and the second operating voltage is a1, a1 is less than or equal to IV. The first preset temperature is greater than or equal to 50° C.

During a process of implementing the application, since the n-type charge generation layer 13 and the p-type charge generation layer 14 are adjacent to each other, the n-type doping material 131 in the n-type charge generation layer 13 and the p-type doping material 141 in the p-type charge generation layer 14 undergo an electrochemical reaction at an interface in a high temperature environment. Thus, damage is caused to the p-type doping material 141, and structural defects in the p-type charge generation layer 14 is caused, so that the operating voltage of the light-emitting device layer 10 rises sharply. In the display panel provided by the embodiment of the present application, after the light-emitting device layer 10 operates at a high temperature greater than or equal to 50° C. and the preset current density for a preset time, the absolute value of the difference value between the second operating voltage of the light-emitting device layer and the first operating voltage at the preset current density is less than or equal to 1V, so as to enable the light-emitting device layer to have better stability at the high temperature. Reactivity of the interface between the n-type charge generation layer 13 and the p-type charge generation layer 14 at high temperatures is effectively reduced, thereby improving stability and display effect of the display panel.

In one embodiment of the present application, the light-emitting device layer has a third operating voltage after operating at the preset current density and a second preset temperature for the preset time. The absolute value of a difference value between the first operating voltage and the third operating voltage is a2, a2 is less than a1, and the second preset temperature is less than 50° C.

In one embodiment of the present application, the second operating voltage is greater than the first operating voltage, and the third operating voltage is greater than the first operating voltage.

In one embodiment of the present application, the preset time is greater than 0 hours and less than or equal to 120 hours, and the preset current density is greater than or equal to 5 mA/cm2.

In one embodiment of the present application, the absolute value of the difference value between the second operating voltage and the first operating voltage is less than or equal to 0.5V.

In one embodiment of the present application, the absolute value of the difference value between the second operating voltage and the first operating voltage decreases as a doping concentration of the p-type doping material in the p-type charge generation layer decreases.

In one embodiment of the present application, the light-emitting device layer further includes a hole injection layer disposed between the anode and the first light-emitting layer. The hole injection layer is distributed with a first doping material. The first doping material is different from the p-type doping material.

In one embodiment of the present application, the light-emitting device layer further includes a hole injection layer disposed between the anode and the first light-emitting layer. The hole injection layer is distributed with a first doping material. The first doping material is the same as the p-type doping material. A doping concentration of the first doping material in the hole injection layer is different from a doping concentration of the p-type doping material in the p-type charge generation layer.

In one embodiment of the present application, a mass percentage content of the p-type doping material in the p-type charge generation layer is greater than or equal to 0.1% and less than or equal to 20%.

In one embodiment of the present application, the light-emitting device layer further includes a first hole transport layer disposed between the p-type charge generation layer and the second light-emitting layer, a lowest unoccupied orbital energy level of the p-type doping material is greater than −5.5 eV, and a highest occupied orbital energy level of a material of the first hole transport layer is greater than −6.5 eV.

In one embodiment of the present application, a difference value between the lowest unoccupied orbital energy level of the p-type doping material and the highest occupied orbital energy level of the material of the first hole transport layer is less than 1 eV.

In one embodiment of the present application, a reddest absorption peak wavelength of the p-type doping material is greater than 400 nm, and a fluorescence emission peak wavelength of the p-type doping material is greater than 500 nm.

In one embodiment of the present application, the light-emitting device layer further includes a buffer layer disposed between the n-type charge generation layer and the p-type charge generation layer. A material of the buffer layer includes at least one of an organic material and a metal material.

Specifically, in one embodiment, please continue to combine FIG. 1 and FIG. 2. The display panel provided by an embodiment of the present application includes a substrate 20, a thin film transistor layer 30 disposed on the substrate 20, and the light-emitting device layer 10 disposed on a side of the thin film transistor layer 30 away from the substrate 20.

The thin film transistor layer 30 is provided with a plurality of thin film transistors. The light-emitting device layer 10 may be connected to the thin film transistors. The thin film transistors may be used as switches to control transmission and interruption of signals input to the light-emitting device layer 10.

Specifically, the light-emitting device layer 10 includes the anode 11, the first light-emitting layer 12 disposed on one side of the anode 11, the n-type charge generation layer 13 disposed on one side of the first light-emitting layer 12 away from the anode 11, the p-type charge generation layer 14 disposed on one side of the n-type charge generation layer 13 away from the first light-emitting layer 12, the second light-emitting layer 15 disposed on one side of the p-type charge generation layer 14 away from the n-type charge generation layer 13, and the cathode 16 disposed on one side of the second light-emitting layer 15 away from the p-type charge generation layer 14.

The anode 11 is disposed on a side of the light-emitting device layer 10 adjacent to the thin film transistor layer 30, and the anode 11 may be connected to the thin film transistors in the thin film transistor layer 30 to receive signals.

Figure 3:
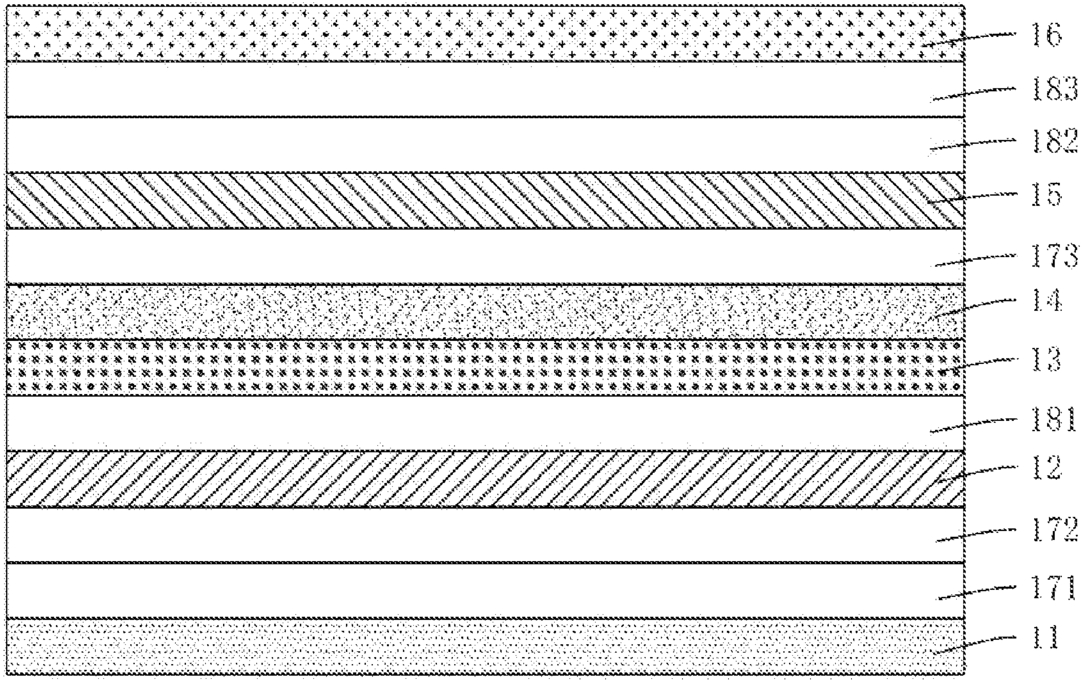
FIG. 3 is another structural schematic diagram of a light-emitting device layer in a display panel provided by the embodiment of the present application.

In one embodiment, please refer to FIG. 1 and FIG. 3, the light-emitting device layer 10 further includes a hole injection layer 171 disposed on a side of the anode 11 adjacent to the first light-emitting layer 12, a second hole transport layer 172 disposed between the hole injection layer 171 and the first light-emitting layer 12, a first electron transport layer 181 disposed between the first light-emitting layer 12 and the n-type charge generation layer 13, a first hole transport layer 173 disposed between the p-type charge generation layer 14 and the second light-emitting layer 15, a second electron transport layer 182 disposed on a side of the second light-emitting layer 15 adjacent to the cathode 16, and an electron injection layer 183 disposed between the second electron transport layer 182 and the cathode 16.

It should be noted that the display panel provided in the embodiment of the present application is an organic light-emitting diode display panel with stacked layers. That is, the light-emitting device layer 10*a* has a plurality of light-emitting layers. In the embodiment of the present application, two light-emitting layers are used as an example for explanation, and an n-type charge generation layer and a p-type charge generation layer are disposed between two adjacent light-emitting layers.

In addition, an electron blocking layer may be disposed on a side of the first light-emitting layer 12 adjacent to the anode 11, and a hole blocking layer may further be disposed on a side of the first light-emitting layer 12 adjacent to the cathode 16. Similarly, an electron blocking layer may be disposed on a side of the second light-emitting layer 15 adjacent to the anode 11, and a hole blocking layer may also be disposed on a side adjacent to the cathode 16.

In one embodiment, the material of the anode 11 may include a material of indium tin oxide (ITO), and the material of the cathode 16 may include at least one of Mg and Ag.

Further, the n-type charge generation layer 13 may be formed by doping the electron transport material with the n-type doping material 131, and the p-type charge generation layer 14 may be formed by doping the hole transport material with the p-type doping material 141. In one embodiment, the n-type doping material 131 may include active alkali metals, alkaline earth metals, and salt compounds thereof, such as lithium, sodium, potassium, cesium, magnesium, calcium, strontium, barium, ytterbium, lithium fluoride, sodium fluoride, lithium carbonate, cesium carbonate, and lithium nitride. The p-type doping material 141 may include at least one of a metal material and an organic material. Thus, the n-type doping material 131 is distributed in the n-type charge generation layer 13, and the p-type doping material 141 is distributed in the p-type charge generation layer 14.

In one embodiment, a mass percentage content of the p-type doping material 141 in the p-type charge generation layer 14 is greater than or equal to 0.1% and less than or equal to 20%. For example, it may be 0.1%, 2%, 4%, 6%, 8%, 12%, 14%, 16%, 18%, or 20%. A mass percentage content of the n-type doping material 131 in the n-type charge generation layer 13 is greater than or equal to 0.1% and less than or equal to 20%. For example, it may be 0.1%, 2%, 4%, 6%, 8%, 12%, 14%, 16%, 18%, or 20%.

Further, the light-emitting device layer 10 has a first operating voltage to operate at a preset current density, and has a second operating voltage after operating at the preset current density and a first preset temperature for a preset time. The absolute value of a difference value between the first operating voltage and the second operating voltage is a1, a1 is less than or equal to 1V, and the first preset temperature is greater than or equal to 50° C. Thus, the light-emitting device layer has better stability at high temperatures to effectively reduce reactivity of the interface between the n-type charge generation layer 13 and the p-type charge generation layer 14 at high temperatures, thereby improving stability and display effect of the display panel.

In one embodiment, the light-emitting device layer 10 has a third operating voltage after operating at the preset current density and a second preset temperature for the preset time. The absolute value of a difference value between the first operating voltage and the third operating voltage is a2, a2 is less than a1. The second preset temperature is less than 50° C. That is, the display panel provided by the embodiment of the present application also has good stability at non-high temperatures. In a case that the temperature is less than 50° C., reactivity of the interface between the n-type charge generation layer 13 and the p-type charge generation layer 14 at high temperatures is low, and stability of the display panel is better.

It should be noted that the operating voltage of the light-emitting device layer 10 may also increase as the temperature and the operating time increase. Therefore, the second operating voltage is greater than the first operating voltage, and the third operating voltage is greater than the first operating voltage.

In one embodiment, the preset current density may be greater than or equal to 5 mA/cm$^2$, the preset temperature may be greater than or equal to 50° C., and the preset power-on time may be greater than 1 h and less than or equal to 120 h. Further, the preset current density may also be less than or equal to 10 mA/cm$^2$. For example, it may be 5 mA/cm$^2$, 6 mA/cm$^2$, 7 mA/cm$^2$, 8 mA/cm$^2$, 9 mA/cm$^2$, or 10 mA/cm$^2$. The preset temperature may be greater than or equal to 110° C.

In embodiments of the present application, a difference value between the second operating voltage and the first operating voltage is less than or equal to 1V. That is, a difference value between an operating voltage of the light-emitting device layer 10 operating at the preset temperature and the preset power-on time and an initial operating voltage needs to be less than or equal to 1V at a same preset current density. As such, the operating voltage of the light-emitting device layer 10 may be prevented from rising sharply be due to high temperatures. That is, the present application may improve high temperature stability of the light-emitting device layer 10, thereby improving display stability and display effect of the display panel.

Further preferably, the difference value between the second operating voltage and the first operating voltage is less than or equal to 0.5V.

It should be noted that the p-type doping material 141 is distributed in the p-type charge generation layer 14. The embodiments of the present application have found it that the absolute value of the difference value between the second operating voltage and the first operating voltage decreases as a doping concentration of the p-type doping material in the p-type charge generation layer 14 decreases by verification. That is, in the embodiments of the present application, the doping concentration of the p-type doping material 141 in the p-type charge generation layer 14 may be reduced, so as to reduce reactivity between the n-type doping material 131 and the p-type doping material 141 at high temperatures. As such, high-temperature stability of the light-emitting device layer 10 is improved, thereby improving stability and display effect of the display panel.

In embodiments of the present application, the hole injection layer 171 may also be made of a hole transport material doped with a first doping material, and the electron injection layer 183 may also be made of an electron transport material doped with a second doping material. The first doping material is the same as or different from the p-type doping material 141. The second doping material is the same as or different from the n-type doping material 131.

In a case that the first doping material is different from the p-type doping material 141, selection of a material of the p-type doping material 141 may be controlled to control reactivity between the n-type doping material 131 and the p-type doping material 141 at high temperatures. In a case that the first doping material is different from the p-type doping material 141, the doping concentration of the p-type doping material 141 in the p-type charge generation layer 14 may be controlled to control reactivity between the n-type doping material 131 and the p-type doping material 141 at high temperatures.

In one embodiment, a doping concentration of the first doping material in the hole injection layer 171 is different from the doping concentration of the p-type doping material 141 in the p-type charge generation layer 14. For example, the doping concentration of the first doping material in the hole injection layer 171 may be 3%, and the doping concentration of the p-type doping material 141 in the p-type charge generation layer 14 may be 5%.

It should be noted that the reactivity between the n-type doping material 131 and the p-type doping material 141 at high temperatures may be reduced by selecting the p-type doping material 141 in the embodiment of the present application, so that the difference value between the second operating voltage and the first operating voltage is less than or equal to 1V.

Further, properties such as energy level of the p-type doping material 141 have been verified to obtain a suitable material with low reactivity at high temperature in embodiments of the present application.

In one embodiment, a lowest unoccupied orbital energy level of the p-type doping material 141 is greater than −5.5 eV, and a highest occupied orbital energy level of a material of the first hole transport layer is greater than −6.5 eV. A difference between the lowest unoccupied orbital energy level of the p-type doping material 141 and the highest occupied orbital energy level of the material of the first hole transport layer is less than 1 eV, so as to facilitate charge separation.

In one embodiment, a reddest absorption peak wavelength of the p-type doping material 141 is greater than 400 nm, and a fluorescence emission peak wavelength of the p-type doping material 141 is greater than 500 nm. A refractive index of the p-type doping material 141 is greater than or equal to 1.5 and less than or equal to 1.8.

In one embodiment, the p-type doping material 141 may include a dicyanomethane compound, and the dicyanomethane compound includes at least one dicyanomethylene group.

Specifically, the p-type doping material 141 may be selected from at least one compound having a structure represented by formula (1) below:

formular (1)

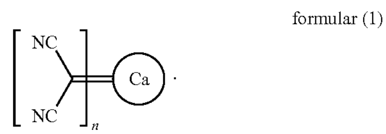

n is an integer greater than 0, ring Ca may be selected from a substituted or unsubstituted aryl group containing 3 to 60 carbon atoms, a substituted or unsubstituted heteroaryl group containing 2 to 60 carbon atoms, or a group composed of a plurality of substituted or unsubstituted aryl groups containing 3 to 60 carbon atoms or a plurality of substituted or unsubstituted heteroaryl groups containing 2 to 60 carbon atoms connected to each other.

Further, compounds represented by formula (1) may further include formulas (1-1), (1-2), (1-3), and (1-4) below:

formular (1-1)

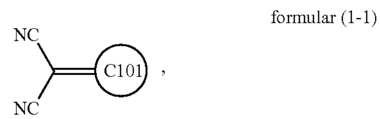

-continued formular (1--2)

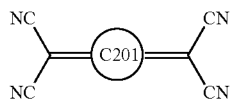

, formular (1-3)

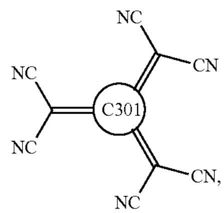

formular (1-4)

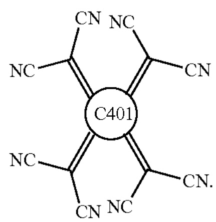

Formula (1-1) may include compounds represented by formulas (1-1a) to (1-1e) below:

formula (1-1a)

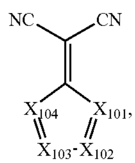

formula (1-1b)

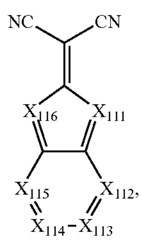

formula (1-1c)

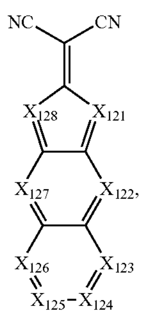

formula (1-1d)

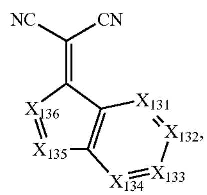

-continued formula (1-1e)

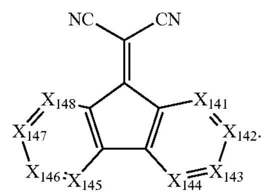

X101 to X104 in formula (1-1a), X111 to X116 in formula (1-1b), X121 to X128 in formula (1-1c), X131 to X136 in formula (1-1d), and X141 to X148 in formula (1-1e), may be independently N or CRa, respectively. In a case that X101 to X148 are each independently CRa, each CRa may be the same or different. Each CRa is independent of each other, and is independently selected from one of hydrogen, deuterium, a substituted or unsubstituted alkyl group containing 1 to 30 carbon atoms, a substituted or unsubstituted aryl group containing 6 to 50 carbon atoms, a substituted or unsubstituted cycloalkyl group containing 3 to 30 carbon atoms, a substituted or unsubstituted heteroaryl group containing 2 to 50 carbon atoms, a substituted or unsubstituted alkylsilyl group containing 1 to 30 carbon atoms, a substituted or unsubstituted arylsilyl group containing 6 to 50 carbon atoms, a cyano group, a nitro group, and a halogen group, respectively. In a case that the above substituents are at adjacent positions, for example, X101 and X102 are both CRa, Ra groups of the substituents may be further connected to each other to form a ring structure.

Formula (1-2) may include compounds represented by formulas (1-2a) to (1-2g) below:

formular (1-2a)

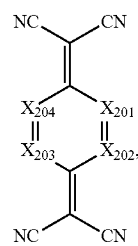

formular (1-2b)

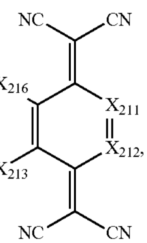

formular (1-2c)

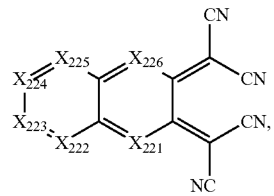

-continued formular (1-2d)

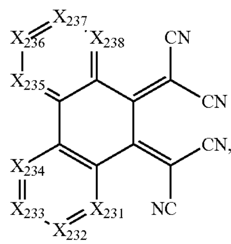

formular (1-e)

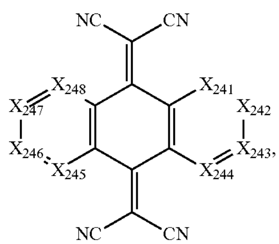

formular (1-2f)

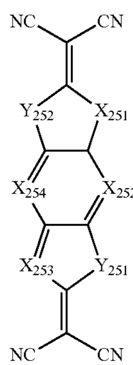

formular (1-2g)

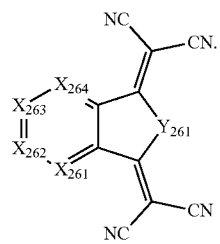

X201 to X204 in formula (1-2a), X211 to X216 in formula (1-2b), X221 to X226 in formula (1-2c), X231 to X238 in formula (1-2d), X241 to X248 in formula (1-2e), X251 to X254 in formula (1-2f), and X261 to X264 in formula (1-2g), may be independently N or CRa, respectively. In a case that X201 to X264 are each independently CRa, each CRa may be the same or different. Each CRa is independent of each other, and is independently selected from one of hydrogen, deuterium, a substituted or unsubstituted alkyl group containing 1 to 30 carbon atoms, a substituted or unsubstituted aryl group containing 6 to 50 carbon atoms, a substituted or unsubstituted cycloalkyl group containing 3 to 30 carbon atoms, a substituted or unsubstituted heteroaryl group containing 2 to 50 carbon atoms, a substituted or unsubstituted alkylsilyl group containing 1 to 30 carbon atoms, a substituted or unsubstituted arylsilyl group containing 6 to 50 carbon atoms, a cyano group, a nitro group, and a halogen group. In a case that the above substituents are at adjacent positions, Ra groups of the substituents may be further connected to each other to form a ring structure.

Y251 and Y252 in formula (1-2f), and Y261 in formula (1-2g) may be independently O, S, NRb or CRcRd, respectively. In a case that Y251, Y252, and Y261 are each independently NRb or CRcRd, each Rb, Rc, and Rd may be the same or different from each other. Each Rb, Rc, and Rd are independent of each other, and are selected from one of hydrogen, deuterium, a substituted or unsubstituted alkyl group containing 1 to 30 carbon atoms, a substituted or unsubstituted aryl group containing 6 to 50 carbon atoms, a substituted or unsubstituted cycloalkyl group containing 3 to 30 carbon atoms, a substituted or unsubstituted heteroaryl group containing 2 to 50 carbon atoms, a substituted or unsubstituted alkylsilyl group containing 1 to 30 carbon atoms, a substituted or unsubstituted arylsilyl group containing 6 to 50 carbon atoms, a cyano group, a nitro group, and a halogen group, respectively. In a case that the above substituents are at adjacent positions, Rb, Rc, Rd, and adjacent Ra groups of the substituents, may be connected to each other to form a ring structure.

Formula (1-3) may further include compounds represented by formulas (1-3a) and (1-3b) below:

formular (1-3a)

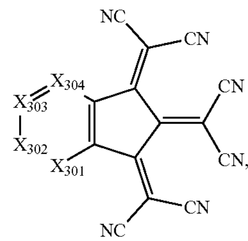

formular (1-3b)

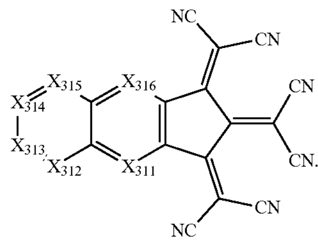

X301 to X304 in formula (1-3a), and X311 to X316 in formula (1-3b), may be independently N or CRa, respectively. In a case that X301 to X316 are each independently CRa, each CRa may be the same or different. Each CRa is independent of each other, and is independently selected from one of hydrogen, deuterium, a substituted or unsubstituted alkyl group containing 1 to 30 carbon atoms, a substituted or unsubstituted aryl group containing 6 to 50 carbon atoms, a substituted or unsubstituted cycloalkyl group containing 3 to 30 carbon atoms, a substituted or unsubstituted heteroaryl group containing 2 to 50 carbon atoms, a substituted or unsubstituted alkylsilyl group containing 1 to 30 carbon atoms, a substituted or unsubstituted arylsilyl group containing 6 to 50 carbon atoms, a cyano group, a nitro group, and a halogen group, respectively. In a case that the above substituents are at adjacent positions, Ra groups of the substituents may be further connected to each other to form a ring structure.

Formula (1-4) may further include compounds represented by formulas (1-4a) to (1-4b) below:

formular (1-4a)

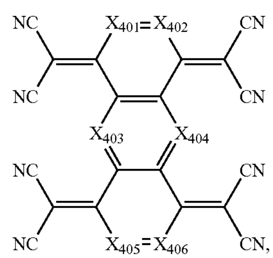

formular (1-4b)

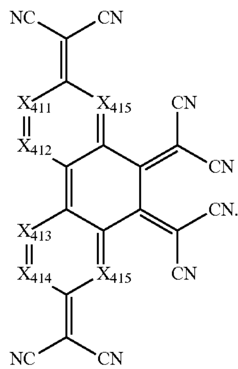

X401 to X406 in formula (1-4a), and X411 to X416 in formula (1-4b), may be independently N or CRa, respectively. In a case that X401 to X416 are each independently CRa, each CRa may be the same or different. Each CRa is independent of each other, and is independently selected from one of hydrogen, deuterium, a substituted or unsubstituted alkyl group containing 1 to 30 carbon atoms, a substituted or unsubstituted aryl group containing 6 to 50 carbon atoms, a substituted or unsubstituted cycloalkyl group containing 3 to 30 carbon atoms, a substituted or unsubstituted heteroaryl group containing 2 to 50 carbon atoms, a substituted or unsubstituted alkylsilyl group containing 1 to 30 carbon atoms, a substituted or unsubstituted arylsilyl group containing 6 to 50 carbon atoms, a cyano group, a nitro group, and a halogen group, respectively. In a case that the above substituents are at adjacent positions, Ra groups of the substituents may be further connected to each other to form a ring structure.

Following the above, the p-type doping material 141 provided by embodiments of the present application may be selected from at least one of PD-01 to PD-141:

PD-01

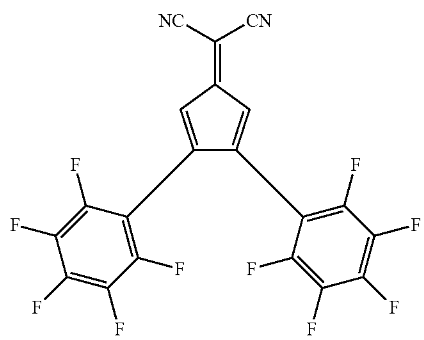

-continued

PD-02

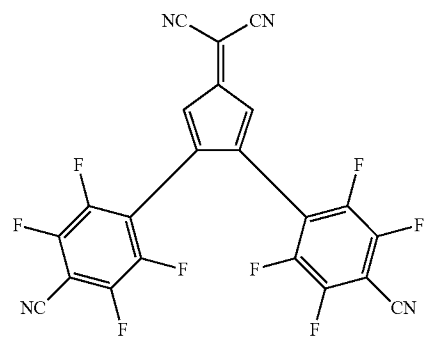

PD-03

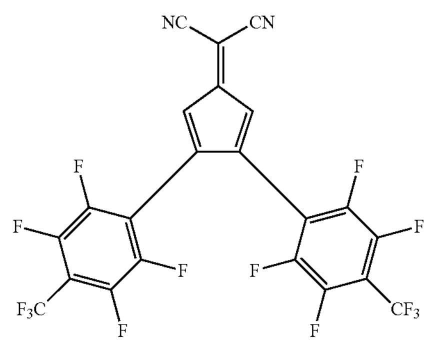

PD-04

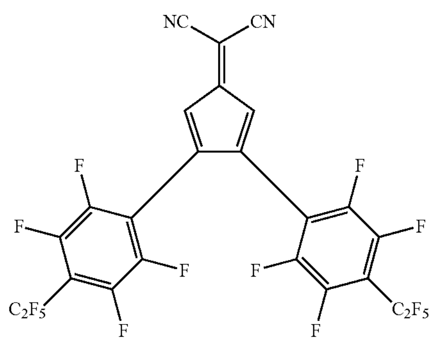

PD-05

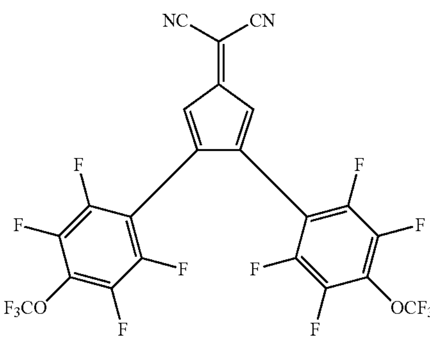

-continued
PD-06
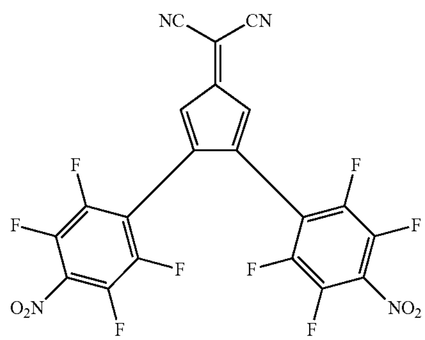
PD-07
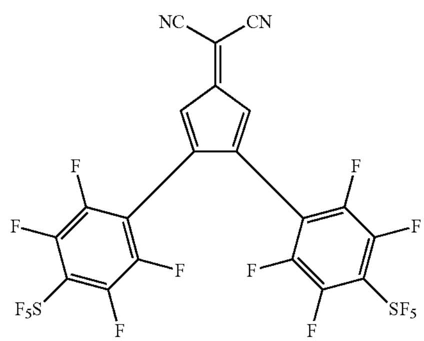
PD-08
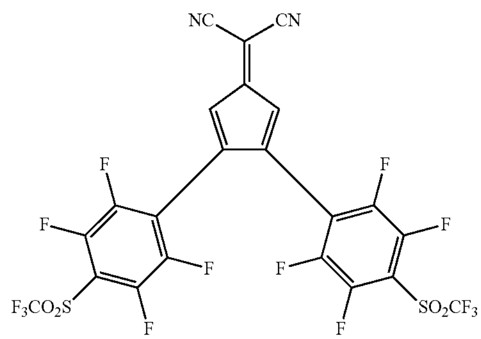
PD-09
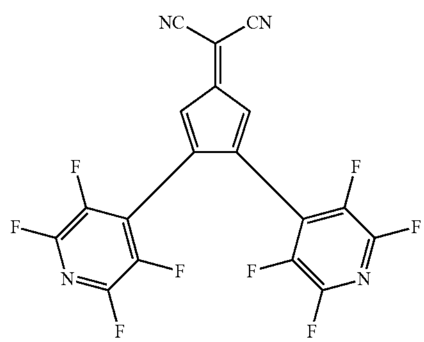
-continued
PD-10
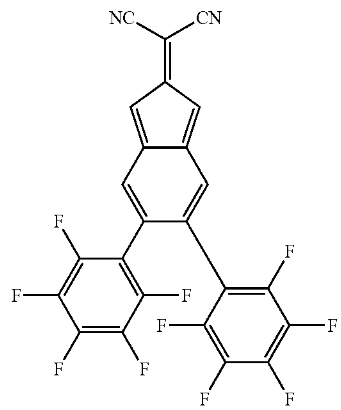
PD-11
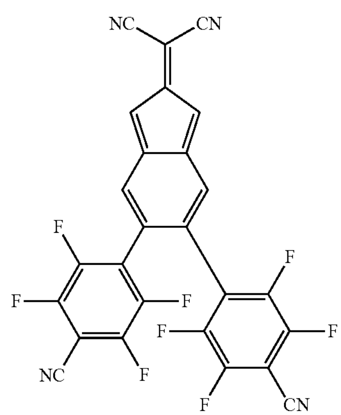
PD-12
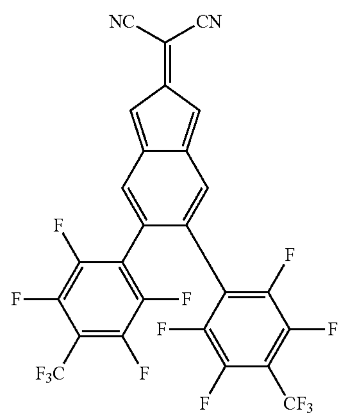
PD-13
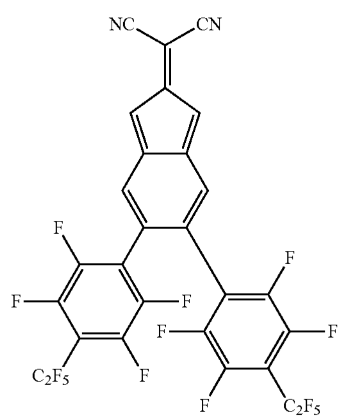

-continued
PD-14
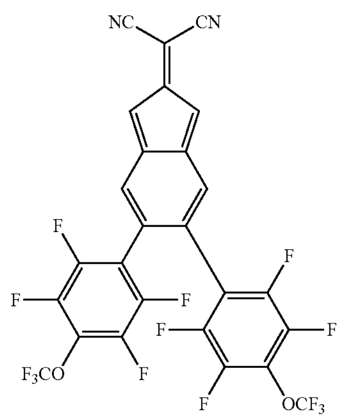
PD-15
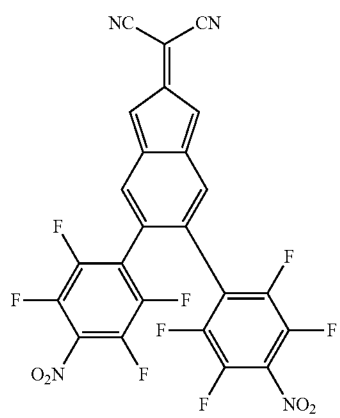
PD-16
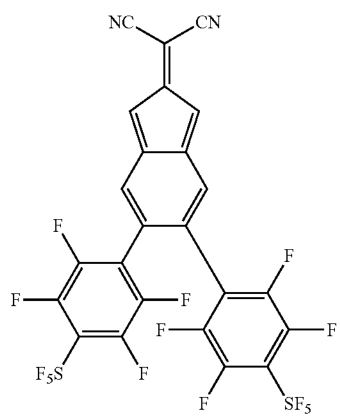
PD-17
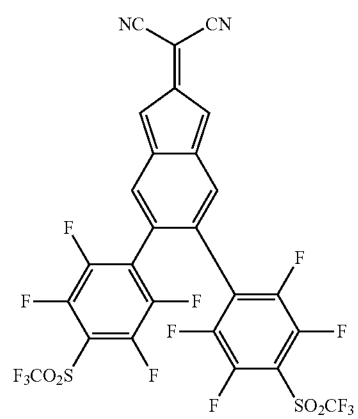
-continued
PD-18
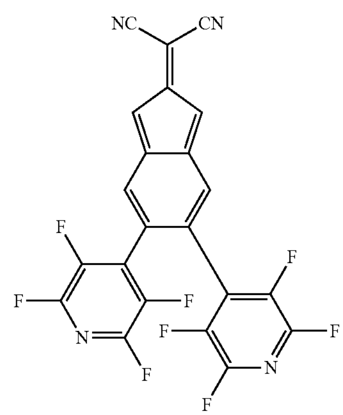
PD-19
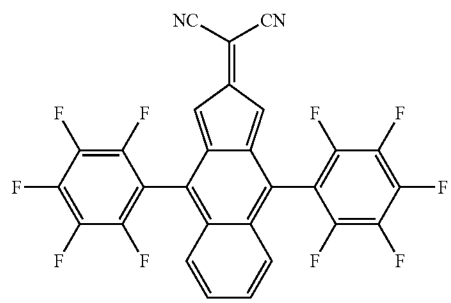
PD-20
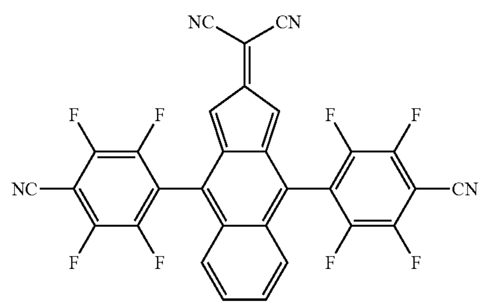
PD-21
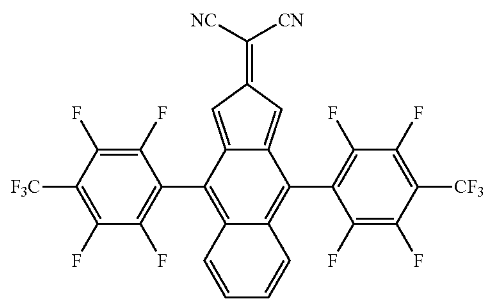
PD-22
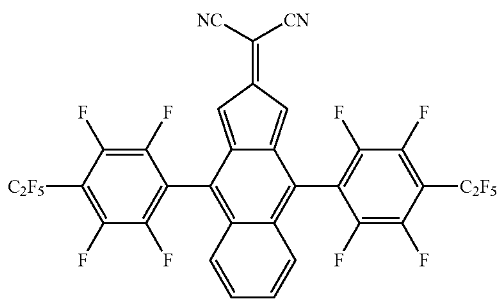

-continued
PD-23
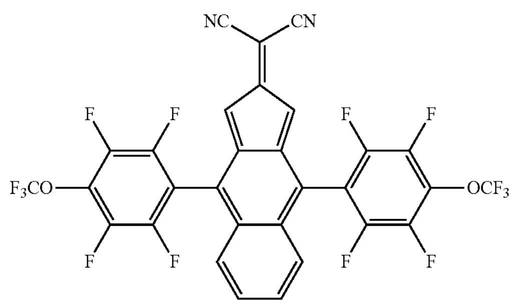
PD-24
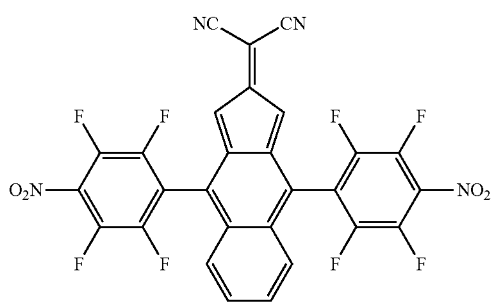
PD-25
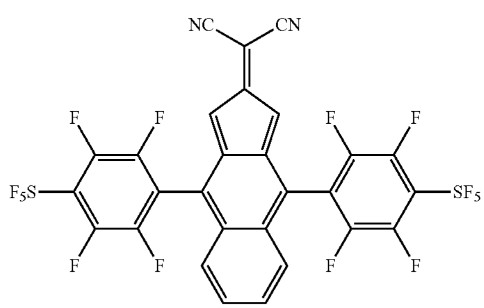
PD-26
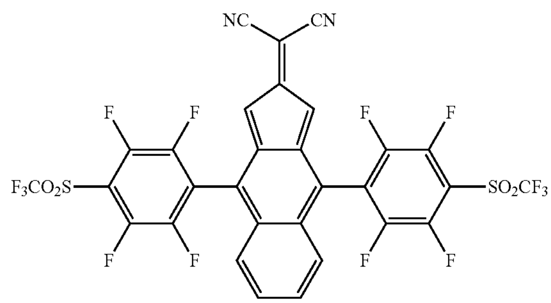
PD-27
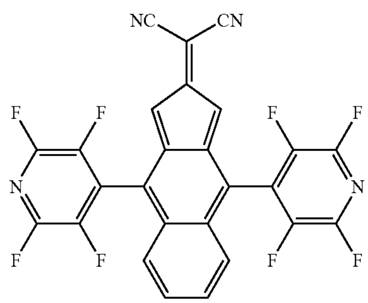
-continued
PD-28
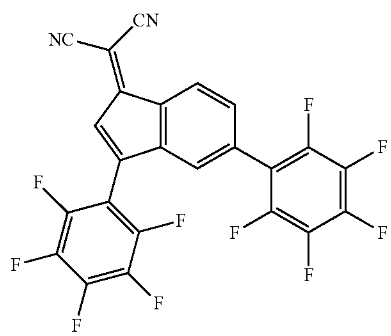
PD-29
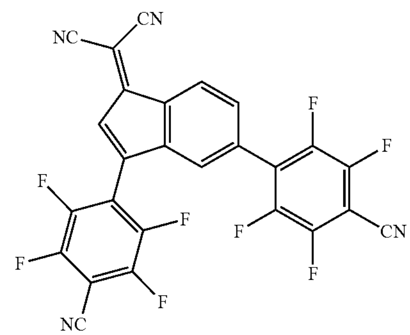
PD-30
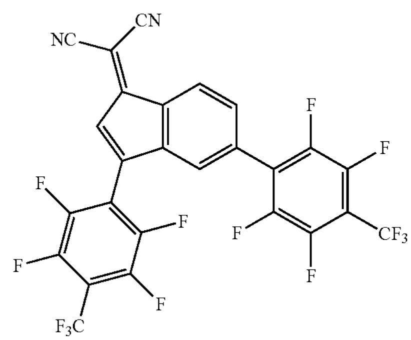
PD-31
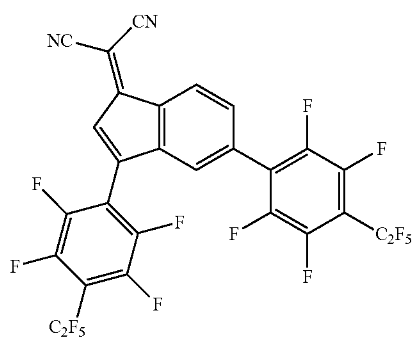

-continued
PD-32
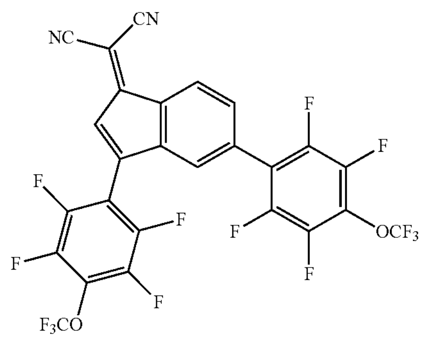
PD-33
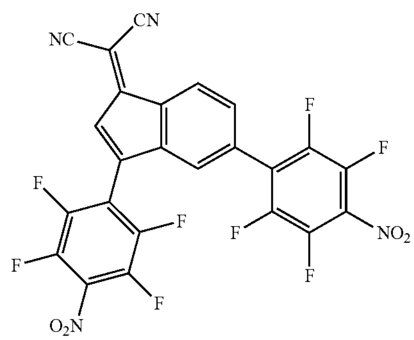
PD-34
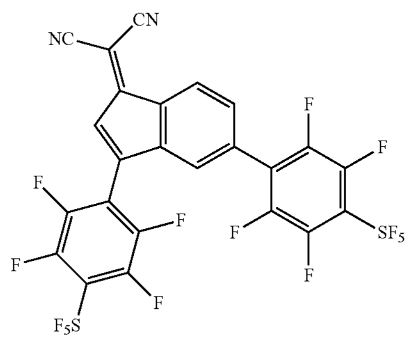
PD-35
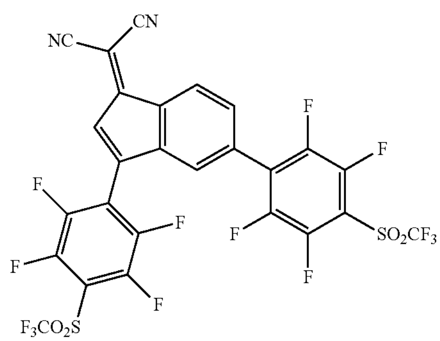
-continued
PD-36
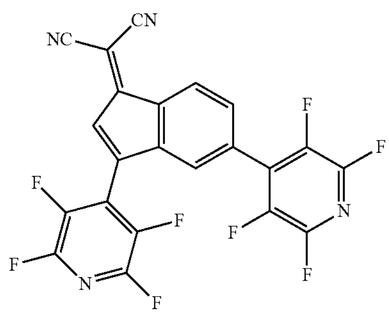
PD-37
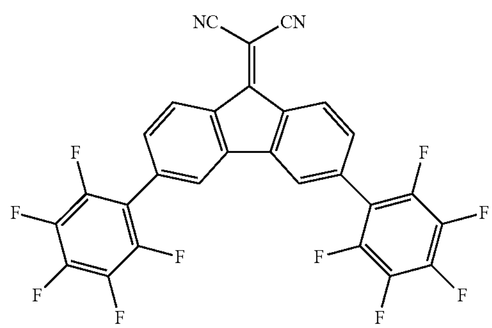
PD-38
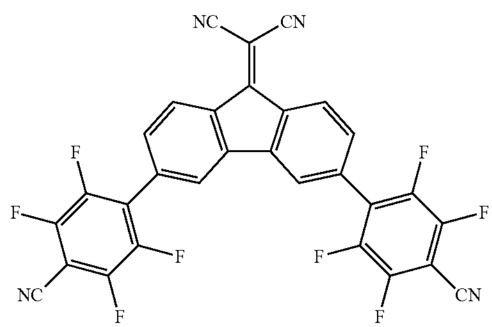
PD-39
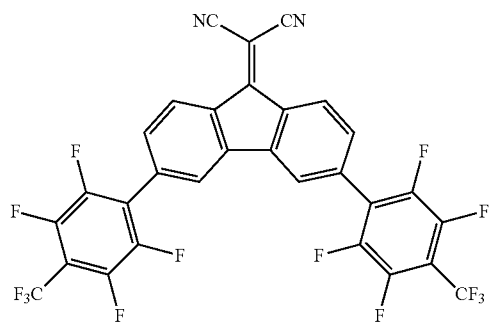
PD-40
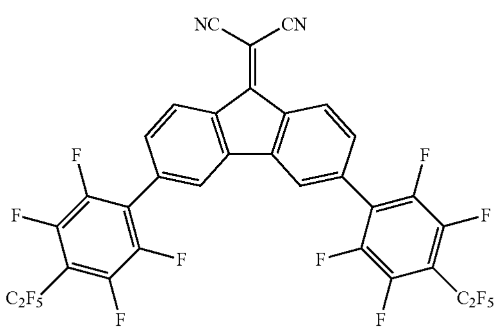

-continued
PD-41
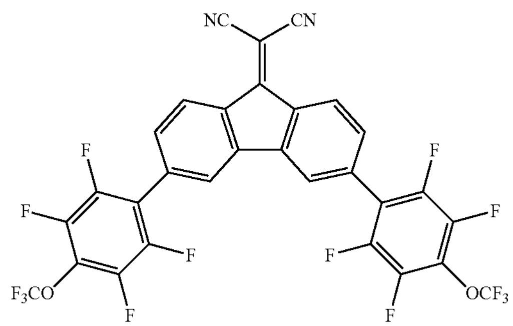
PD-42
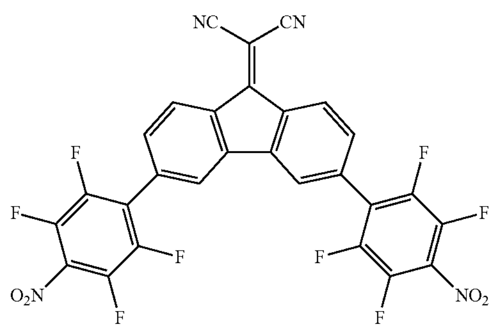
PD-43
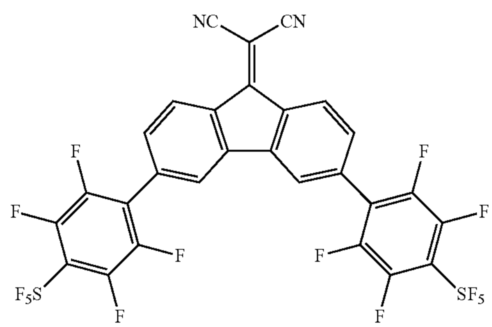
PD-44
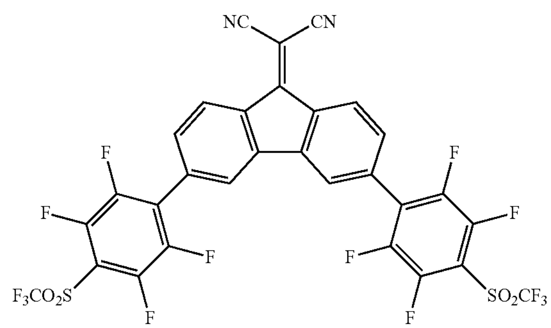
-continued
PD-45
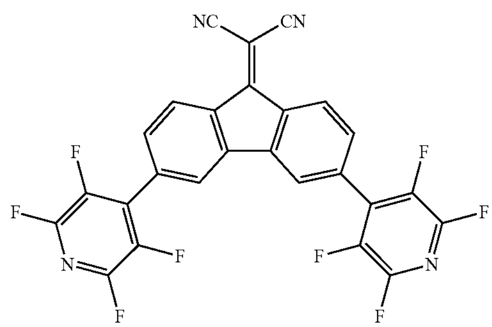
PD-46
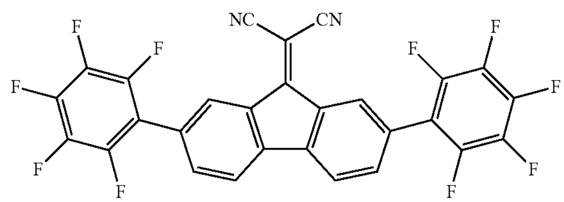
PD-47
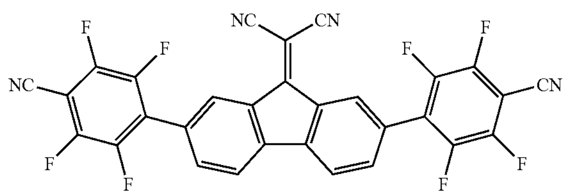
PD-48
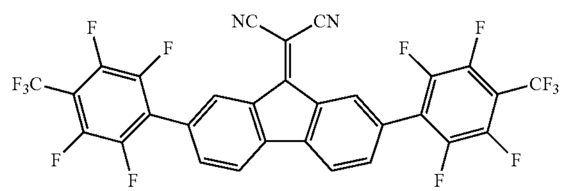
PD-49
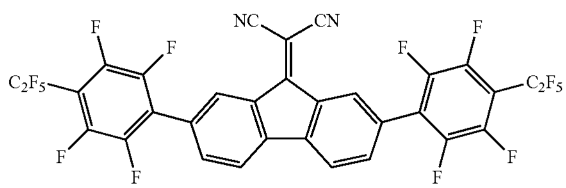
PD-50
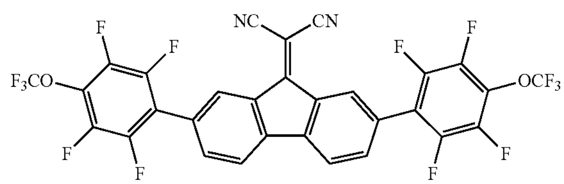
PD-51
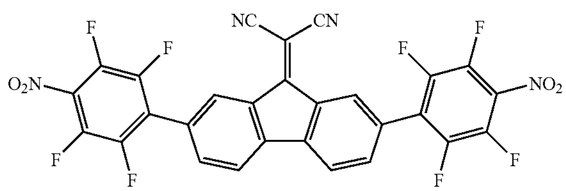

-continued
PD-52
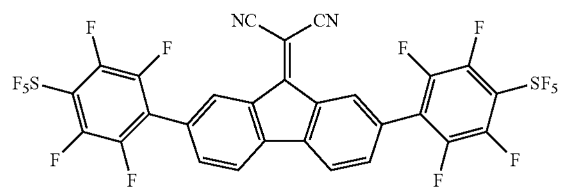
PD-53
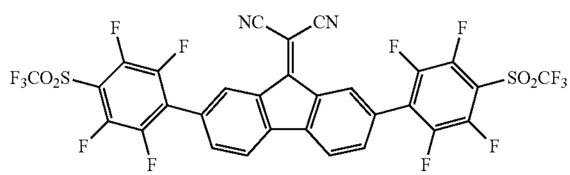
PD-54
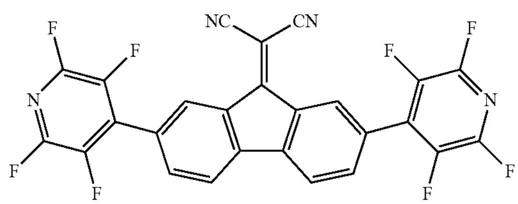
PD-55
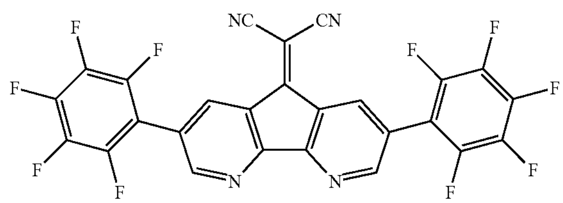
PD-56
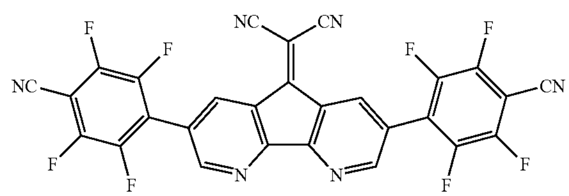
PD-57
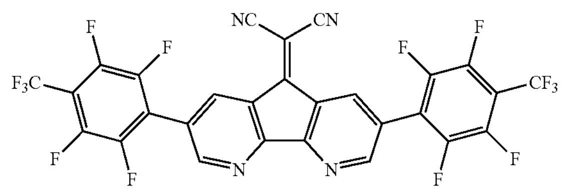
-continued
PD-58
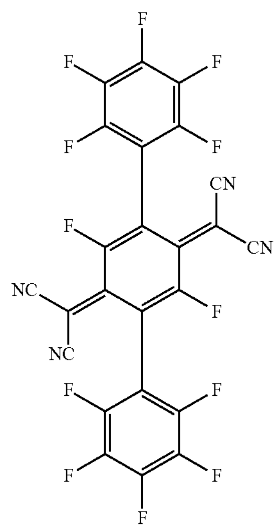
PD-59
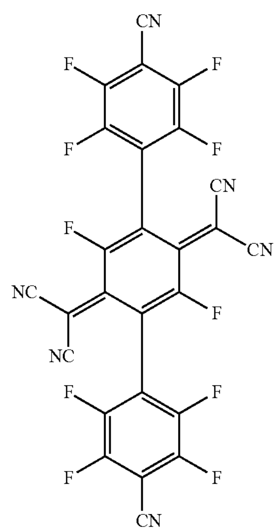
PD-60
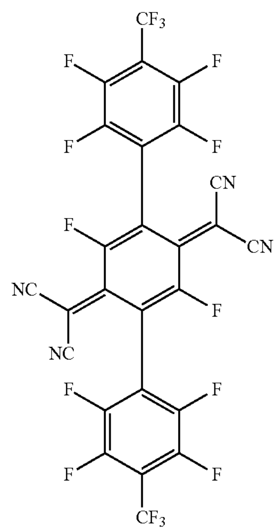

-continued
PD-61
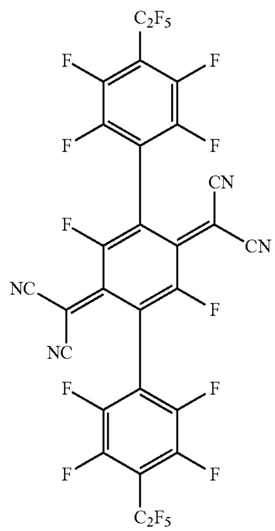
PD-62
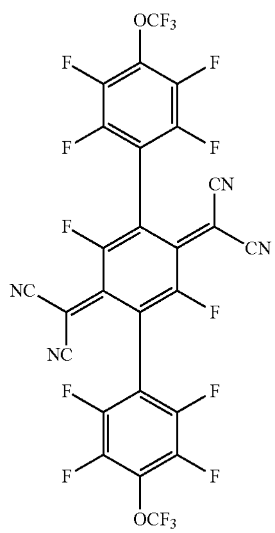
PD-63
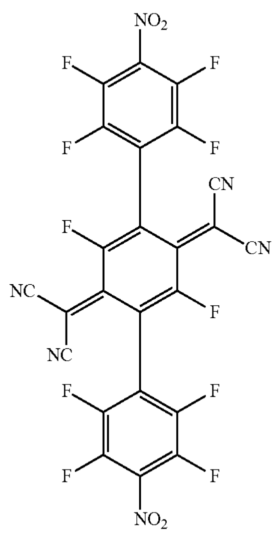
-continued
PD-64
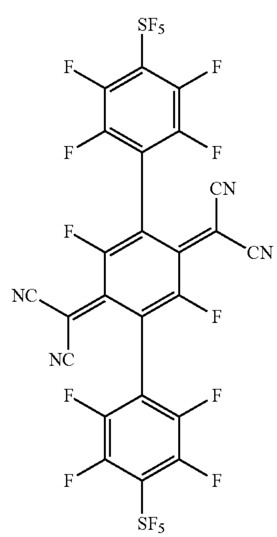
PD-65
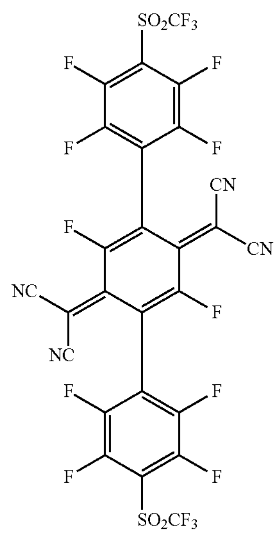
PD-66
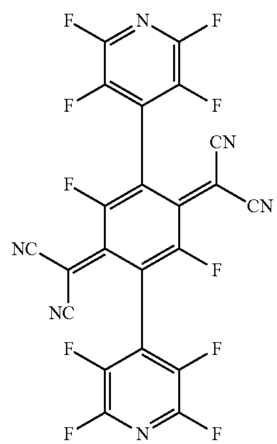

-continued
PD-67
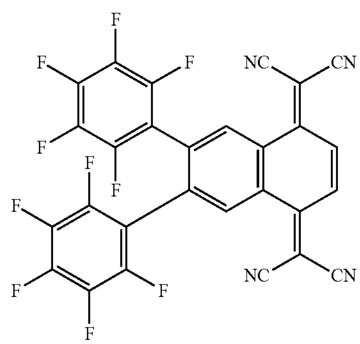
PD-68
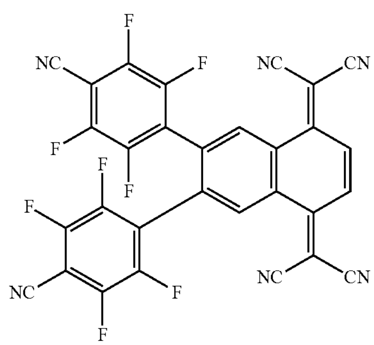
PD-69
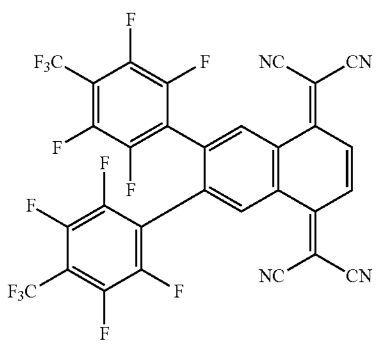
PD-70
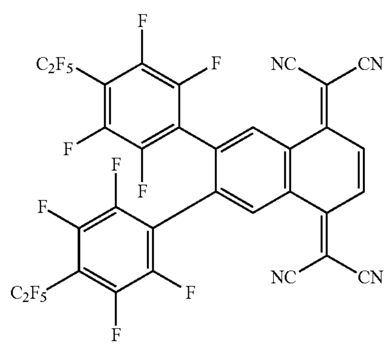
-continued
PD-71
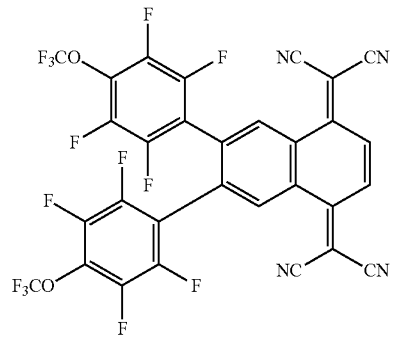
PD-72
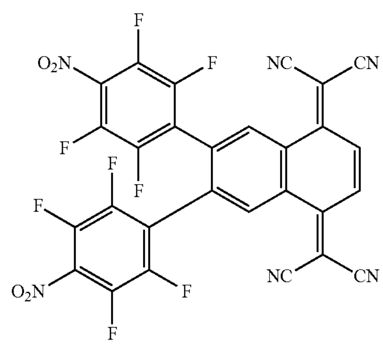
PD-73
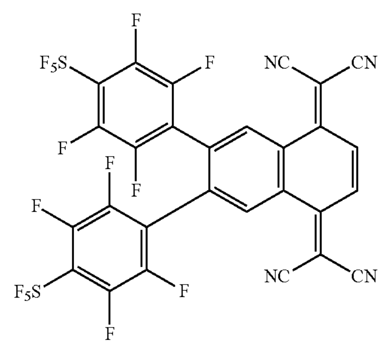
PD-74
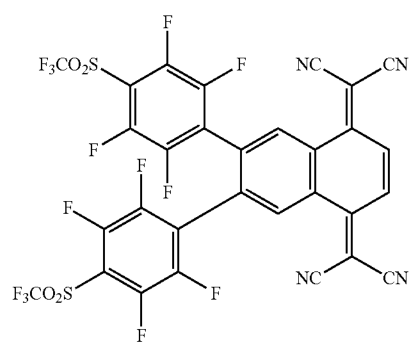

-continued
PD-75
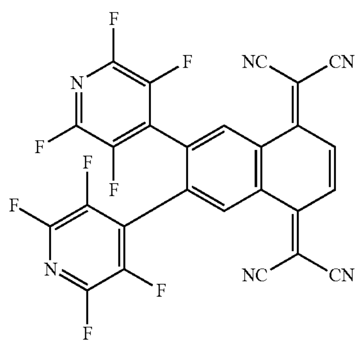
PD-76
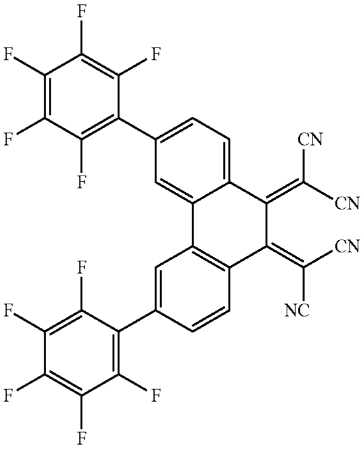
PD-77
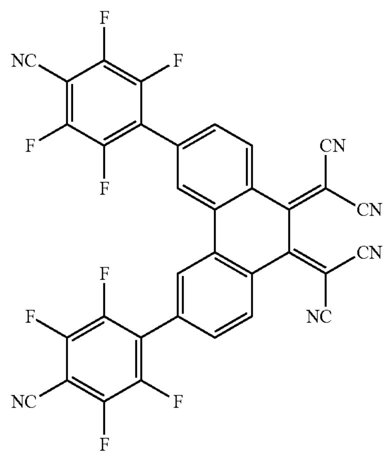
-continued
PD-78
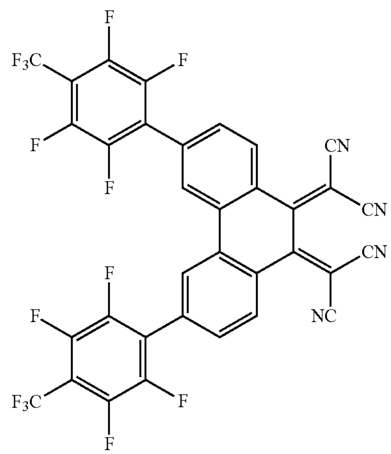
PD-79
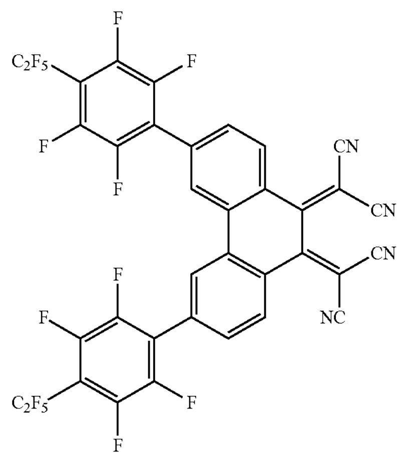
PD-80
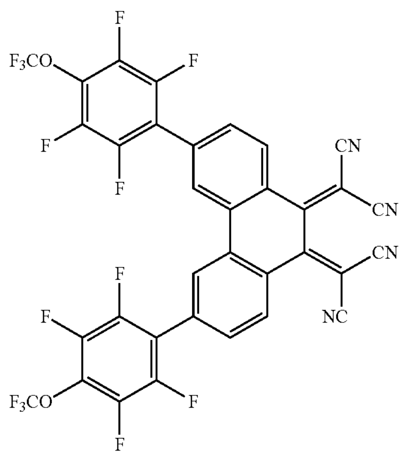

-continued
PD-81
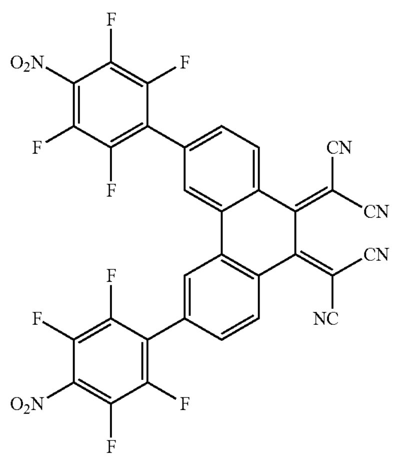
PD-82
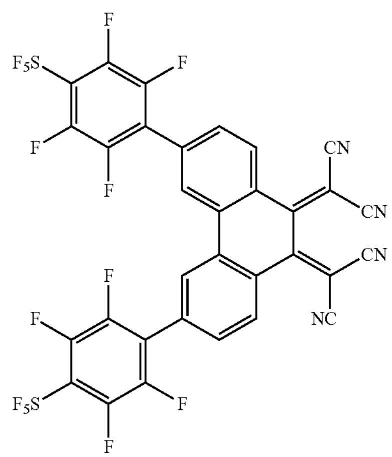
PD-83
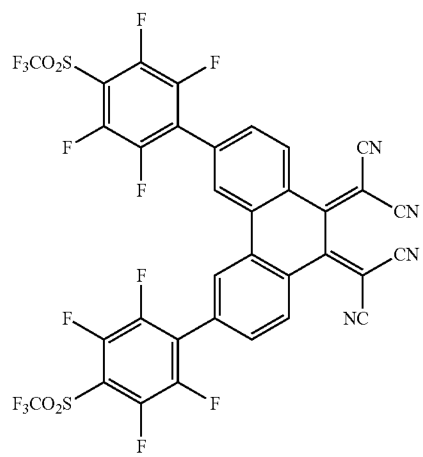
-continued
PD-84
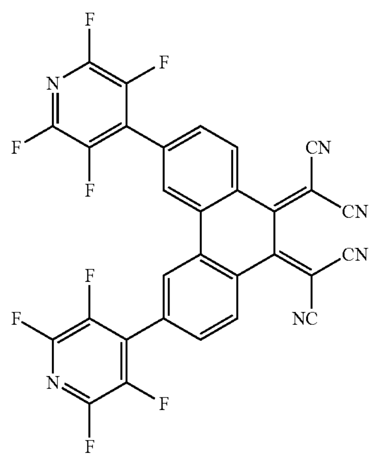
PD-85
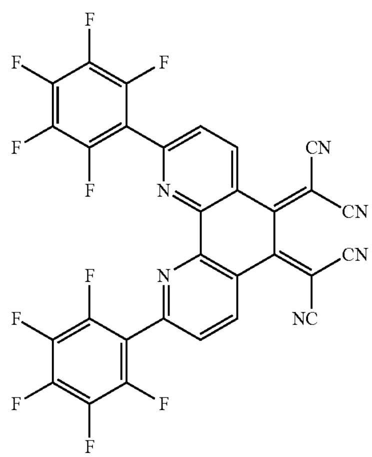
PD-86
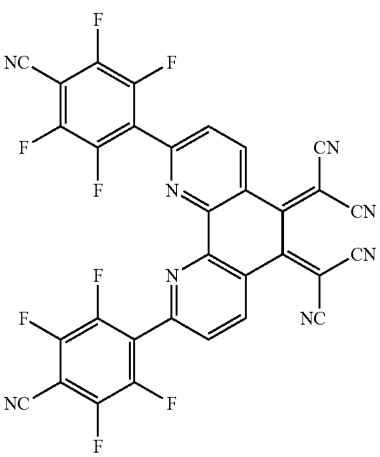

-continued
PD-87
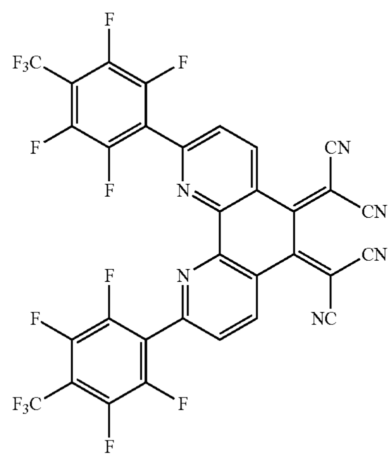
PD-88
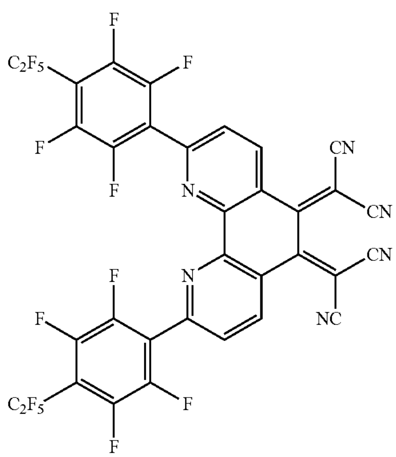
PD-89
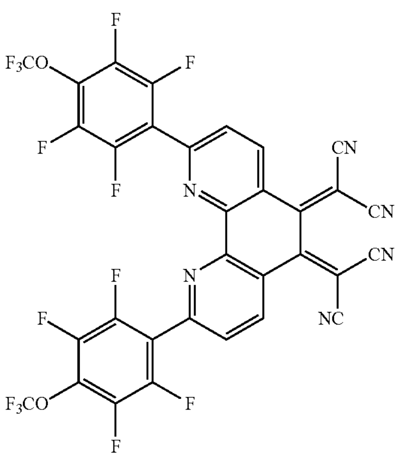
-continued
PD-90
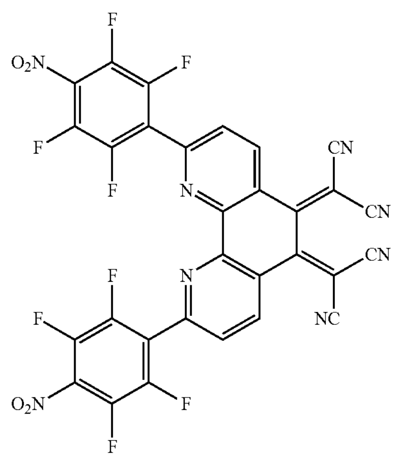
PD-91
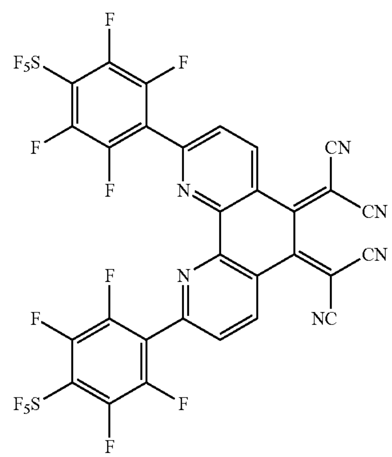
PD-92
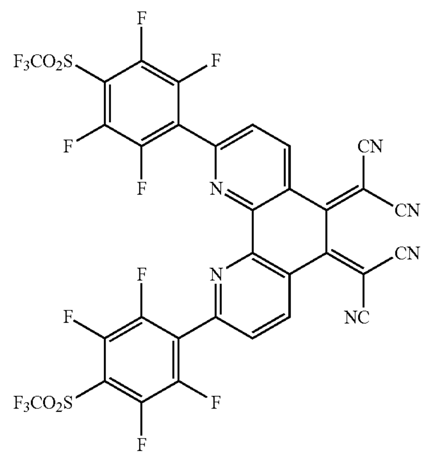

-continued
PD-93
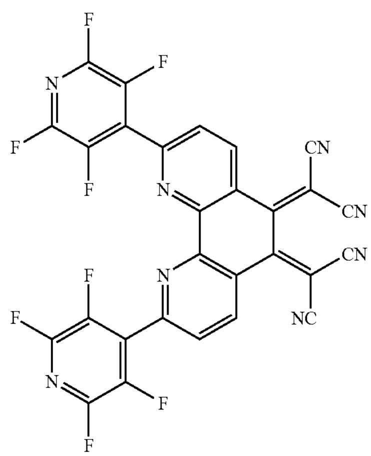
PD-94
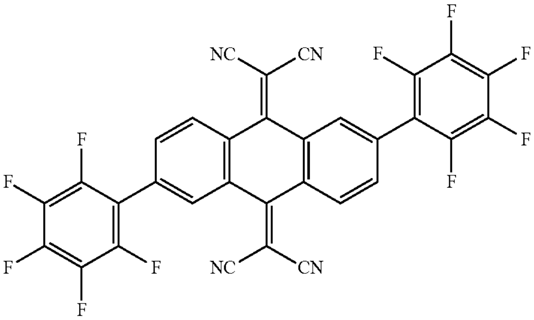
PD-95
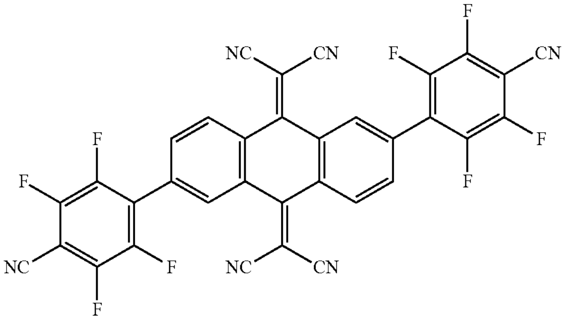
PD-96
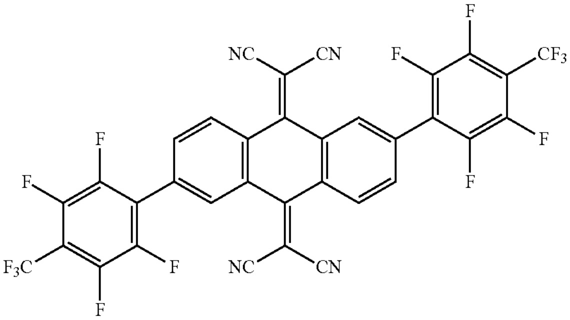
-continued
PD-97
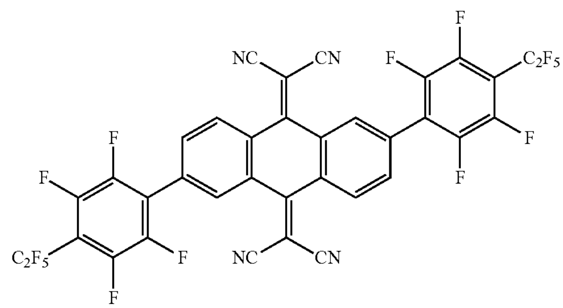
PD-98
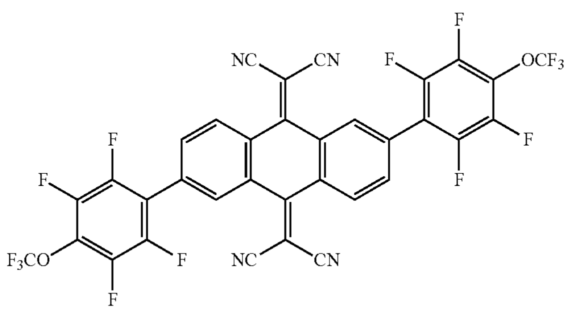
PD-99
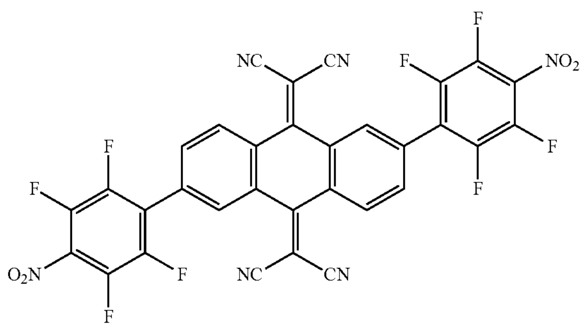
PD-100
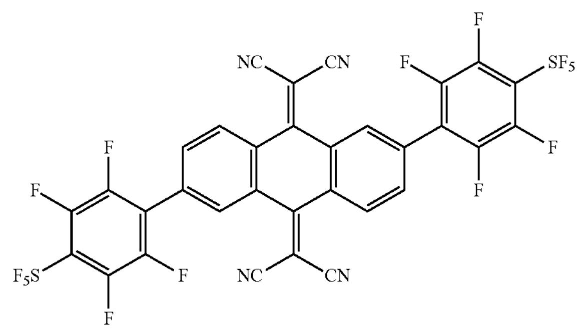

-continued
PD-101
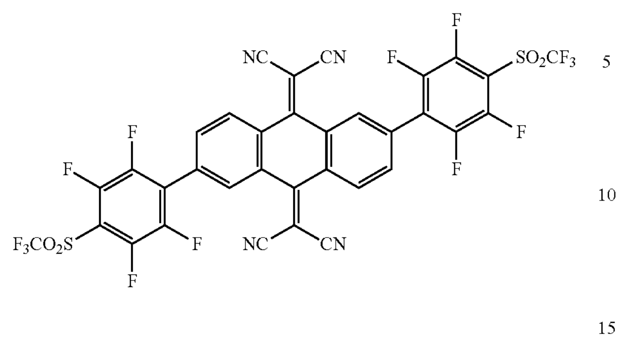
PD-102
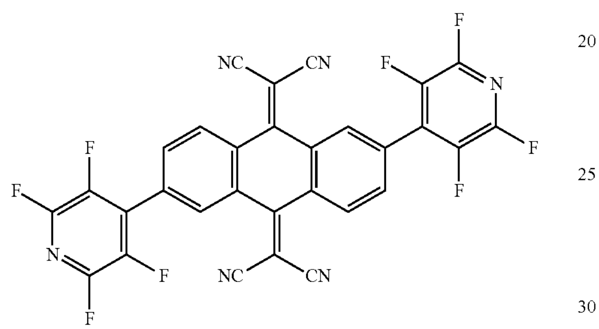
PD-103
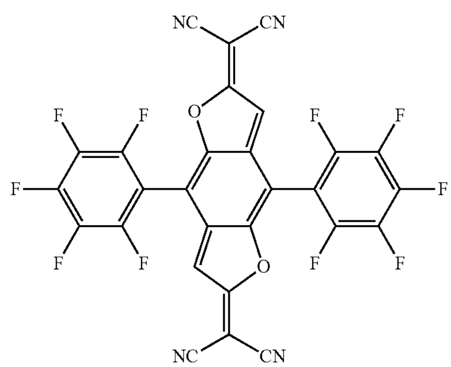
PD-104
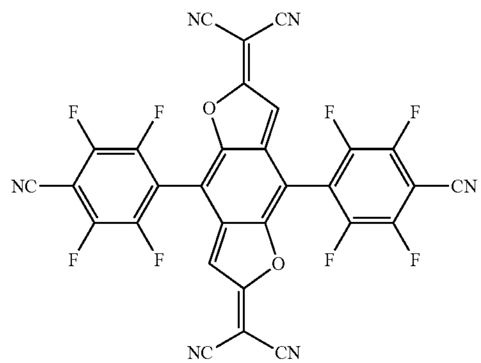
-continued
PD-105
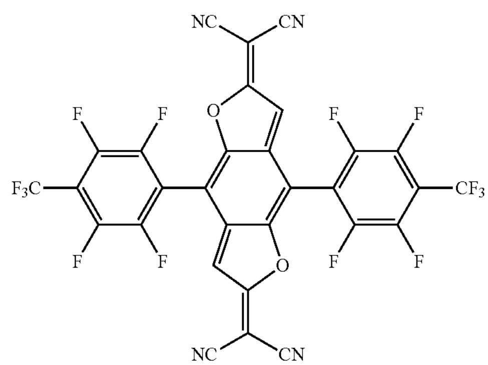
PD-106
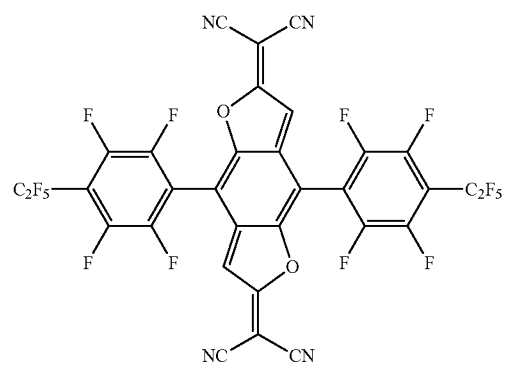
PD-107
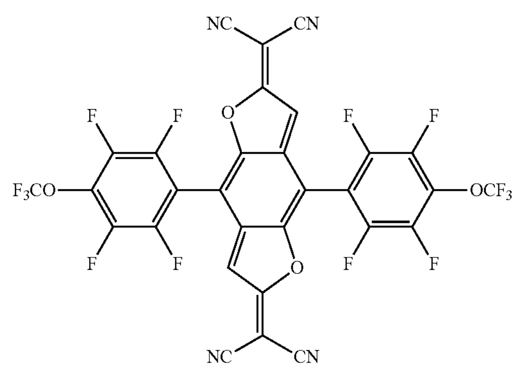
PD-108
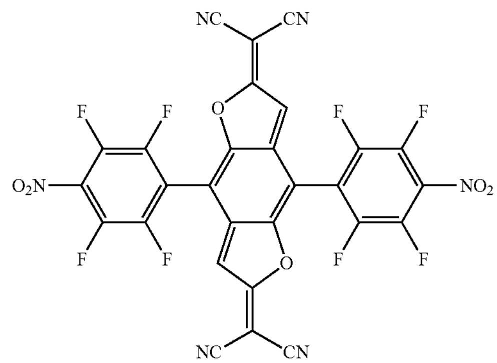

-continued
PD-109
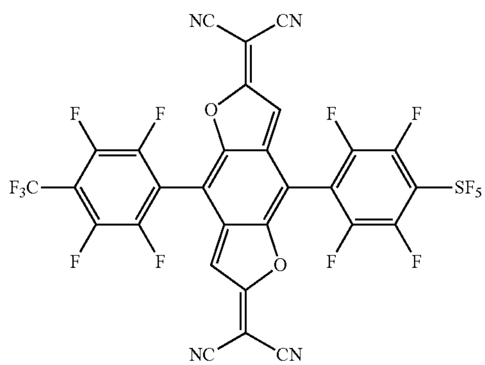
PD-110
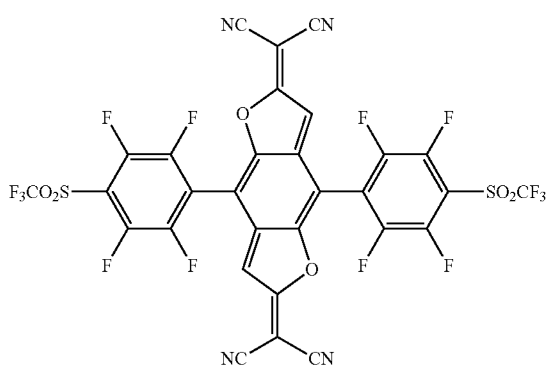
PD-111
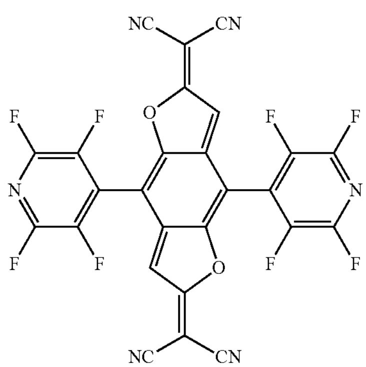
PD-112
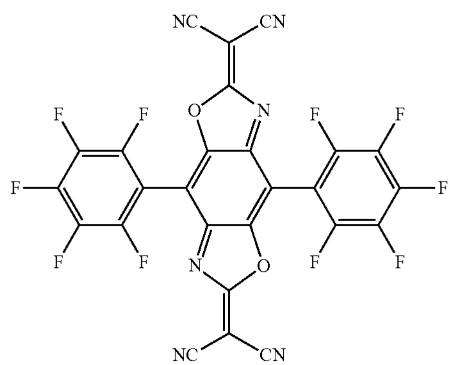
-continued
PD-113
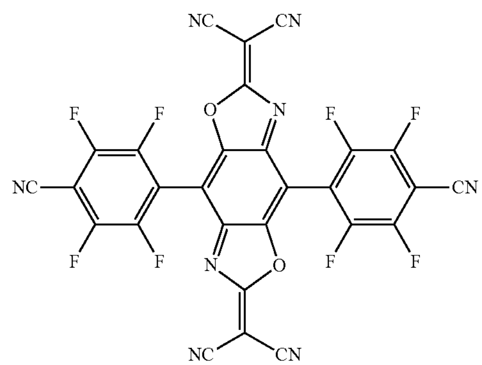
PD-114
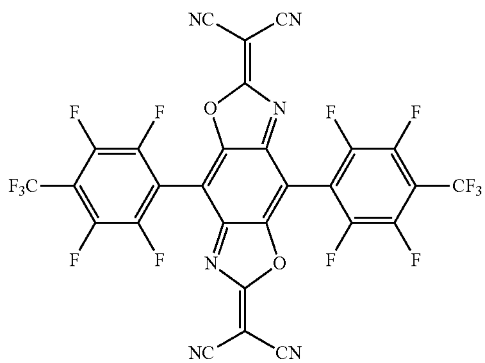
PD-115
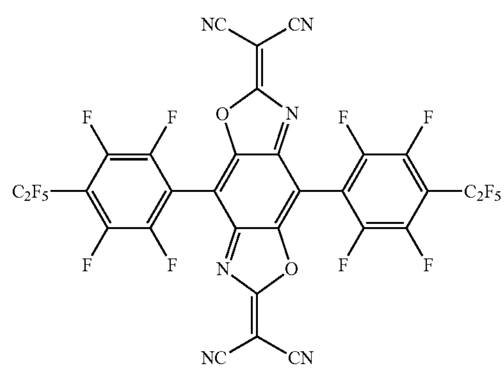
PD-116
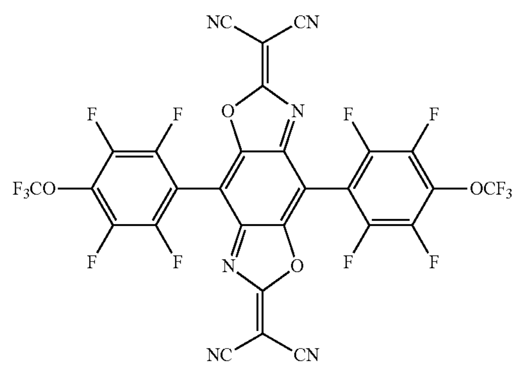

-continued
PD-117
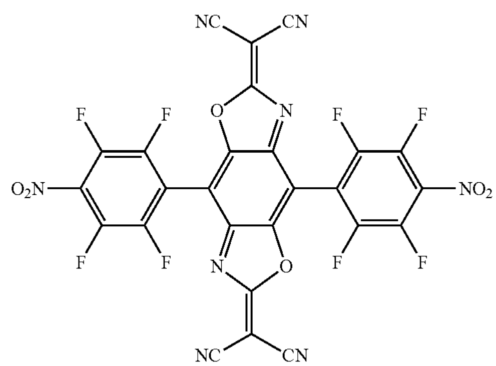
PD-118
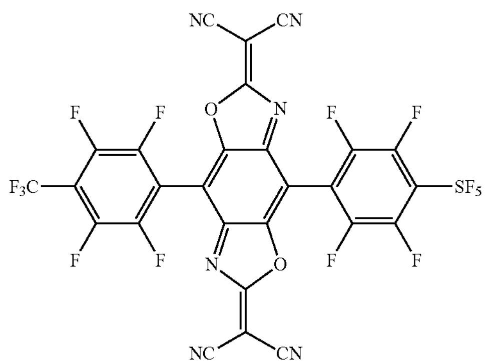
PD-119
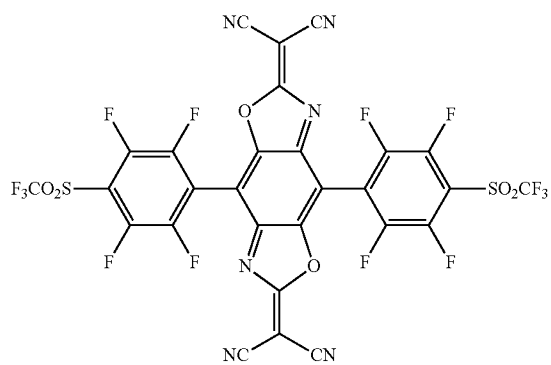
PD-120
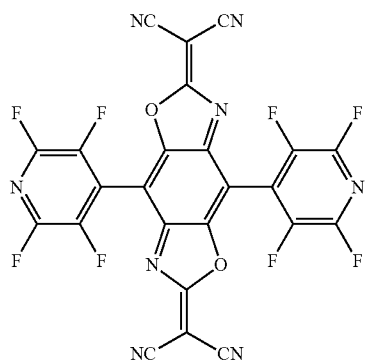
-continued
PD-121
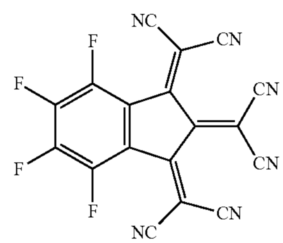
PD-122
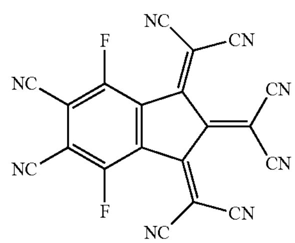
PD-123
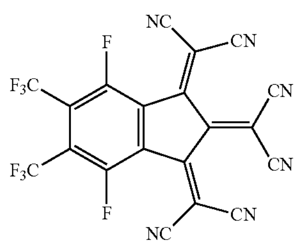
PD-124
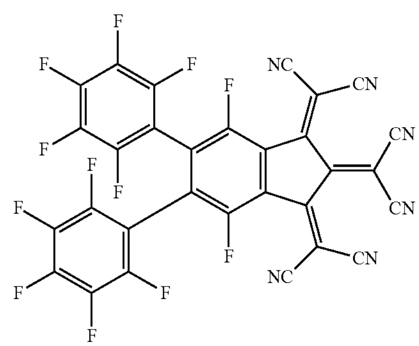
PD-125
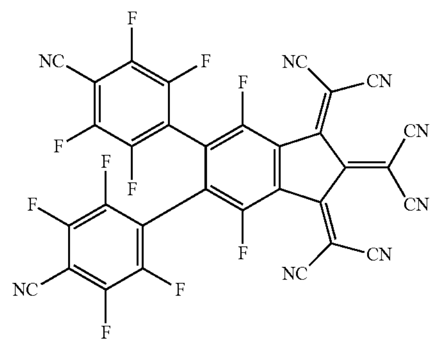

-continued
PD-126
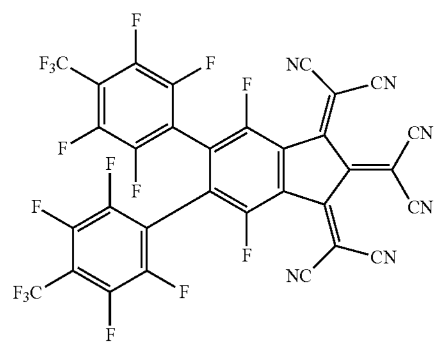
PD-127
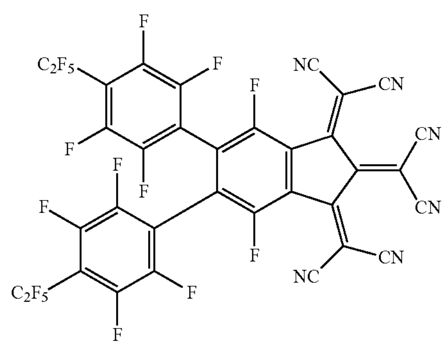
PD-128
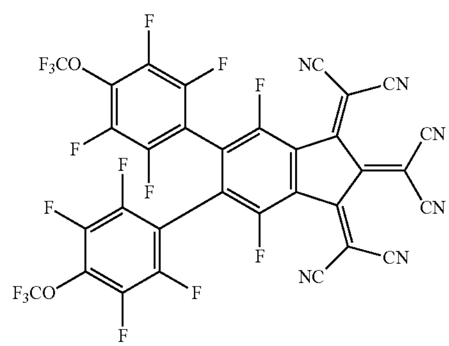
PD-129
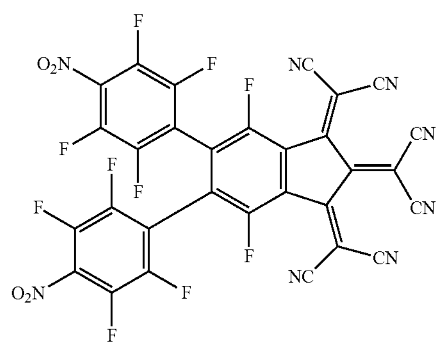
-continued
PD-130
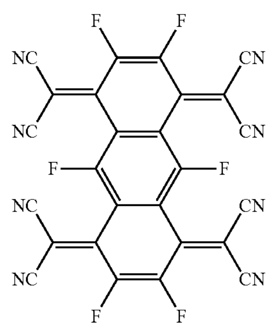
PD-131
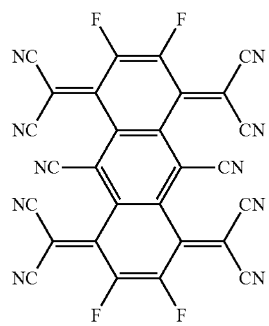
PD-132
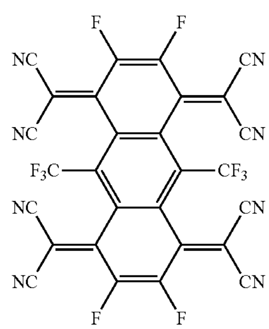
PD-133
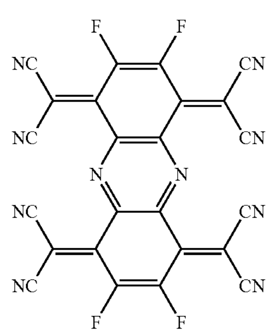
PD-134
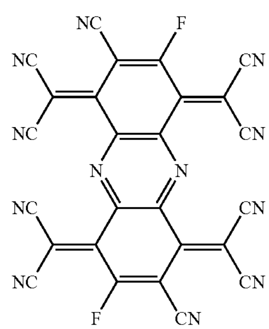

-continued

PD-135

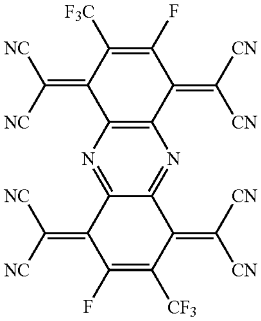

PD-136

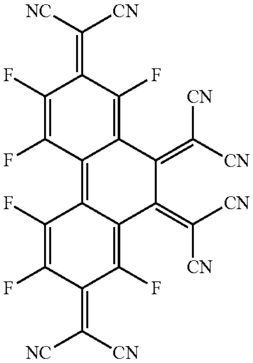

PD-137

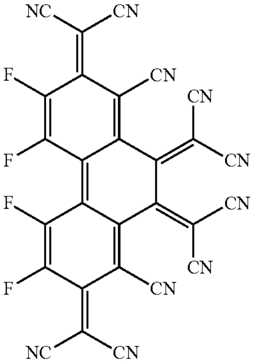

PD-138

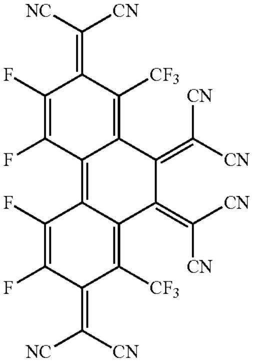

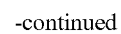
-continued

PD-139

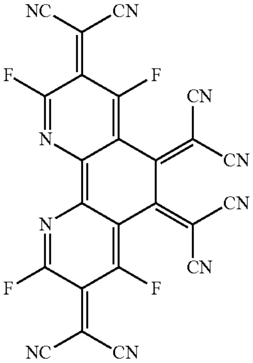

PD-140

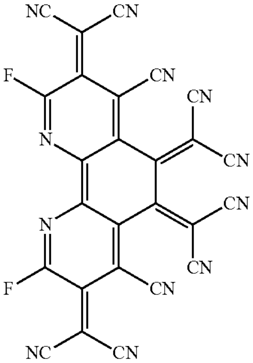

PD-141

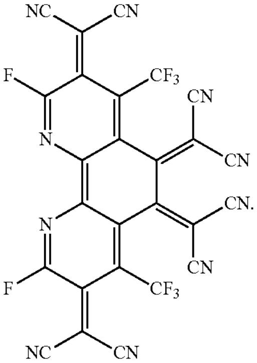

In one embodiment, the hole transport material in the p-type charge generation layer 14 provided by embodiments of the present application may include an aromatic amine compound and contain at least one aromatic amine group. The hole transport material may include at least one of the compounds of formula (2) below:

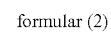
formular (2)

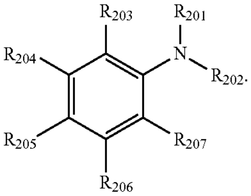

R201~R207 are independent of each other, and are arbitrarily selected from one of hydrogen, deuterium, a substituted or unsubstituted alkyl group containing 1 to 30 carbon atoms, a substituted or unsubstituted aryl group containing 6 to 50 carbon atoms, a substituted or unsubstituted cycloalkyl group containing 3 to 30 carbon atoms, a substituted or unsubstituted heteroaryl group containing 2 to 50 carbon atoms, a substituted or unsubstituted alkylsilyl group containing 1 to 30 carbon atoms, a substituted or unsubstituted arylsilyl group containing 6 to 50 carbon atoms, a cyano group, a nitro group, and a halogen group, respectively. In a case that the above substituents are at adjacent positions, such as R203 and R204, the substituents may be bonded to each other to form a ring structure.

For example, the hole transport material in the p-type charge generation layer 14 may be selected from at least one of compounds below:

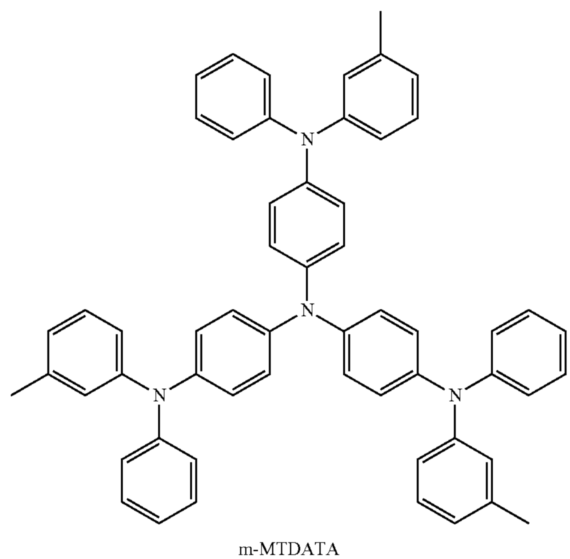

m-MTDATA

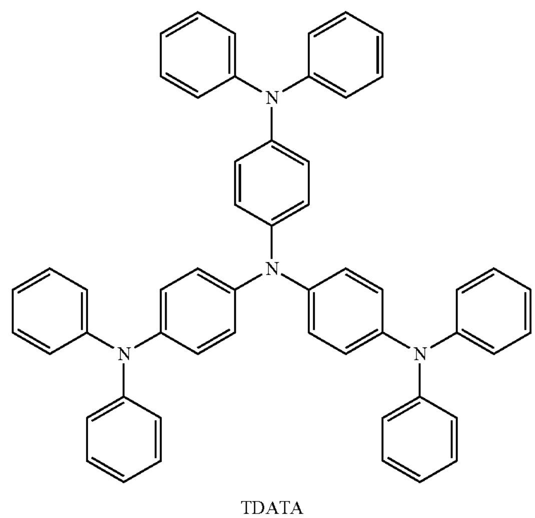

TDATA

-continued

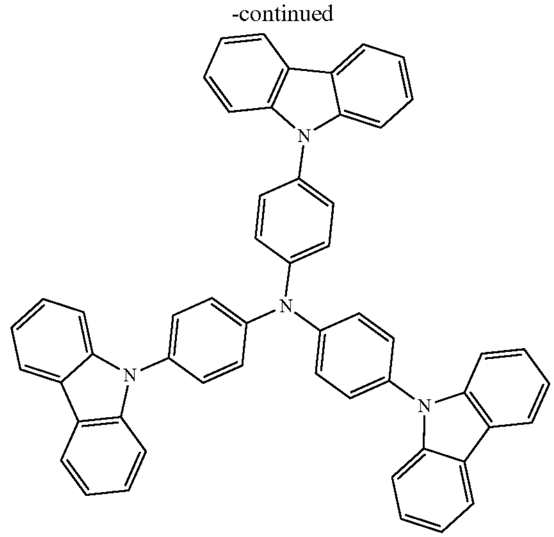

TCTA

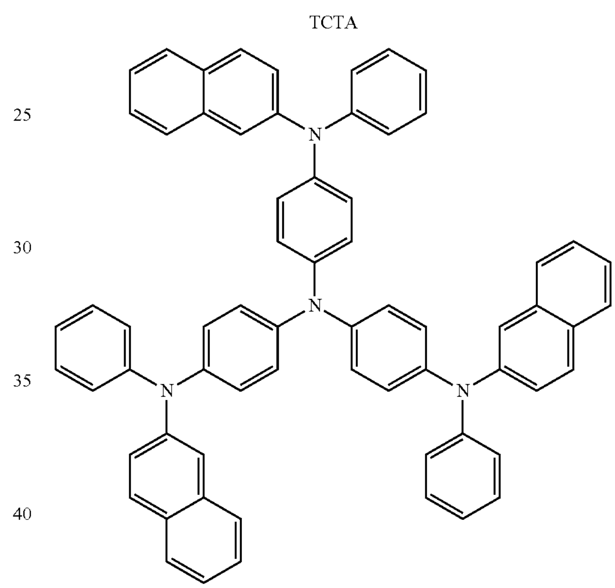

2-TNATA

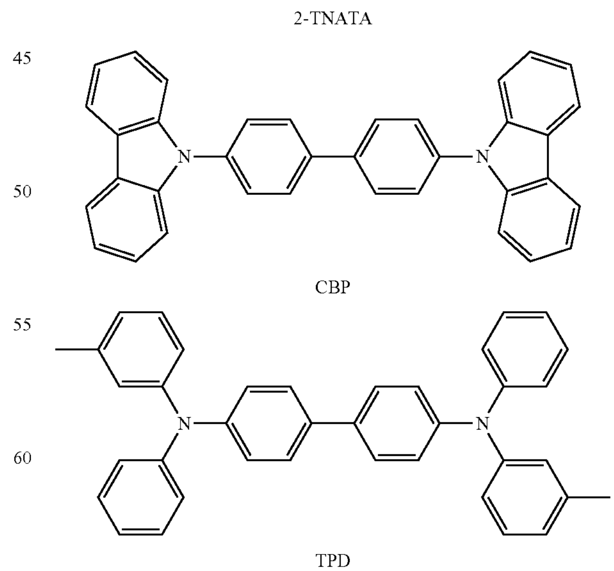

CBP

TPD

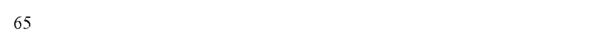

-continued
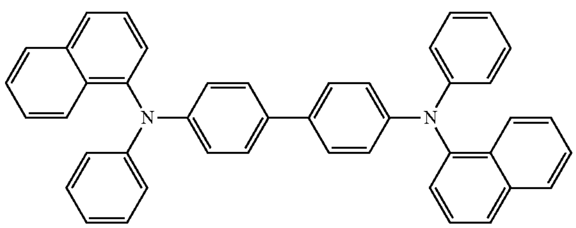
NPB
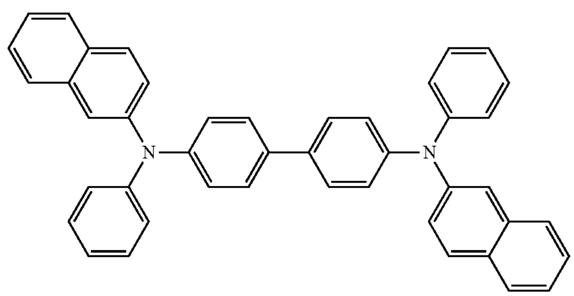
β-NPB
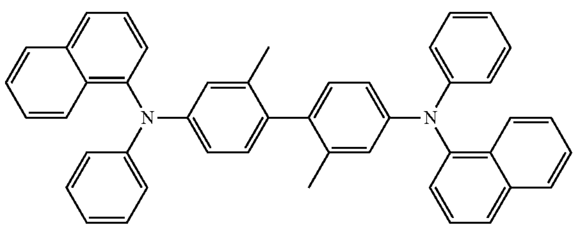
MNPB
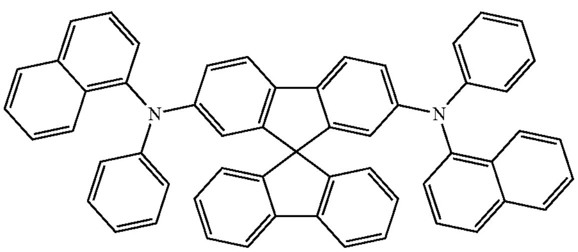
spiro-NPB
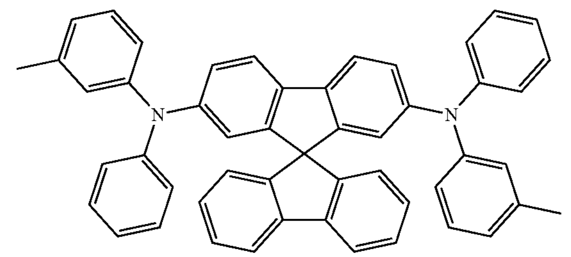
spiro-TPD
-continued
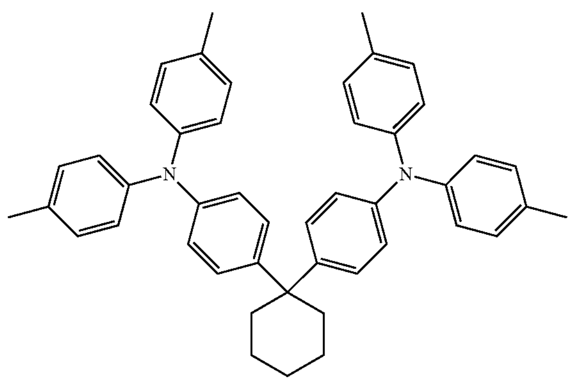
TAPC
HT1
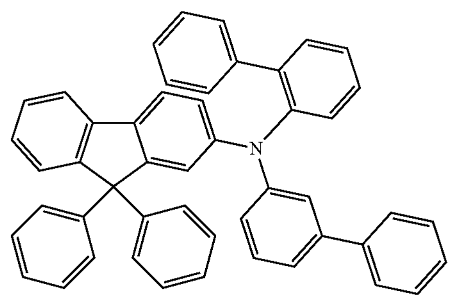
HT2
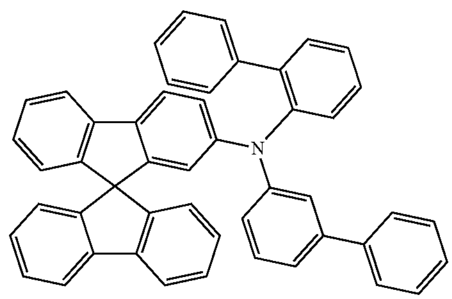
HT3
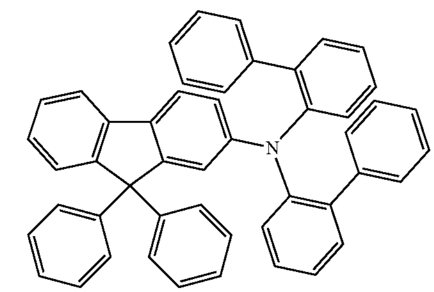
HT4
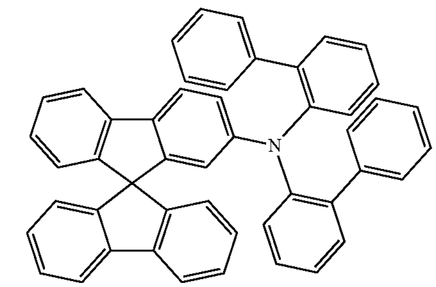

-continued
HT5
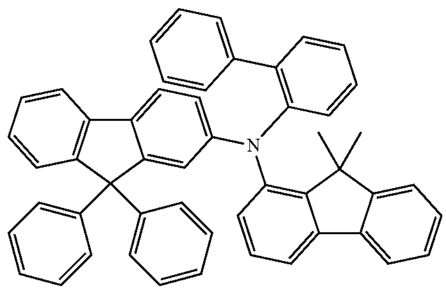
HT6
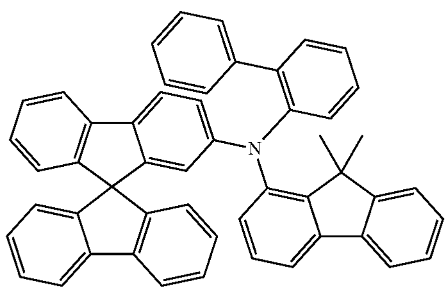
HT7
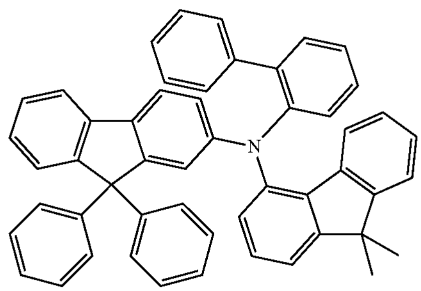
HT8
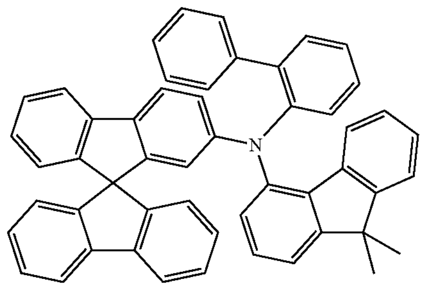
HT9
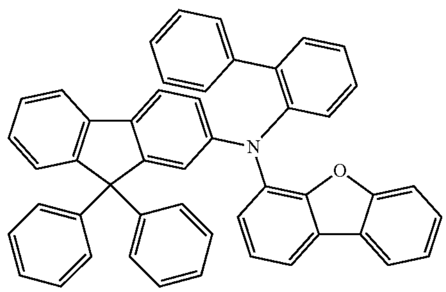
-continued
HT10
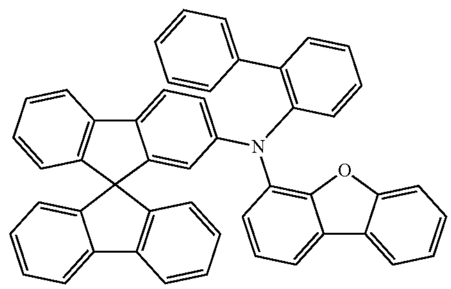
HT11
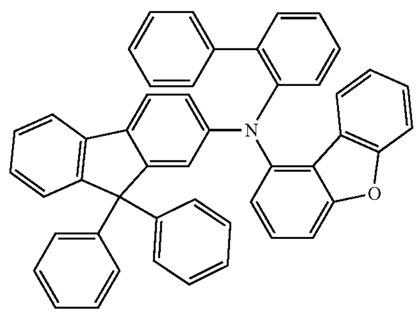
HT12
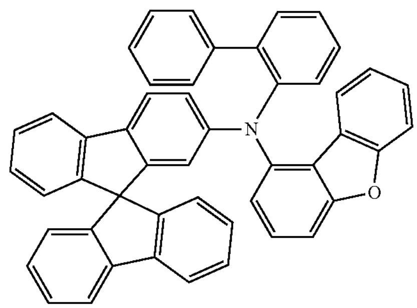
HT13
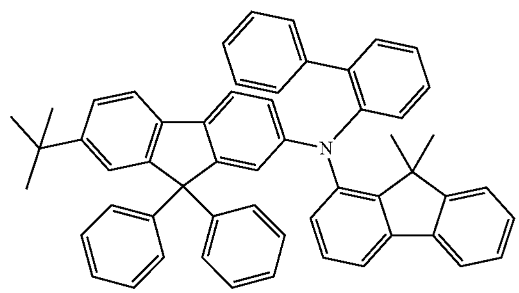
HT14
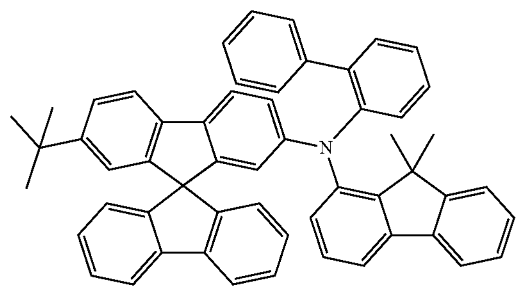

-continued

HT15

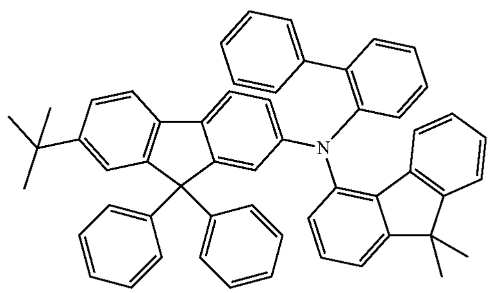

HT16

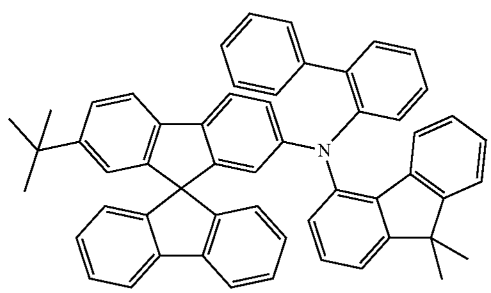

It can be understood that the hole transport materials in the first hole transport layer 173 and the second hole transport layer 172 may also be the same as the hole transport material in the p-type charge generation layer 14 in embodiments of the present application.

In one embodiment, both the first light-emitting layer 12 and the second light-emitting layer 15 may be formed by doping a blue light guest material into a blue light host material. The blue light host material may include at least one of compounds below:

BH1

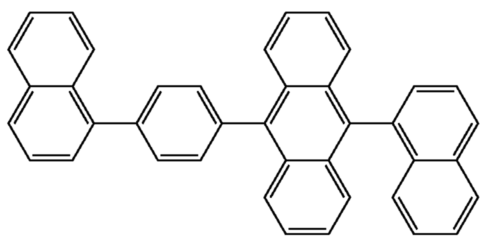

BH2

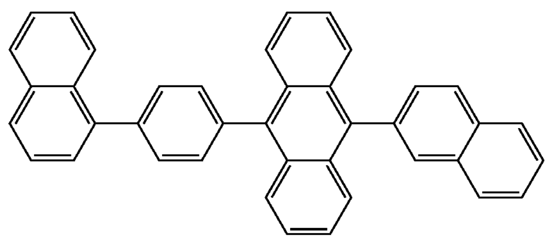

-continued

BH3

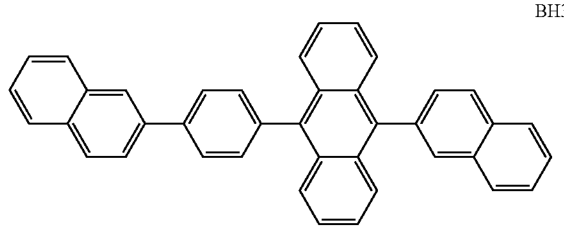

BH4

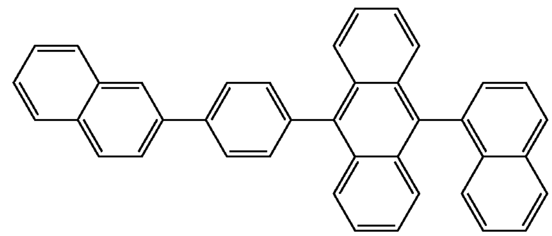

BH5

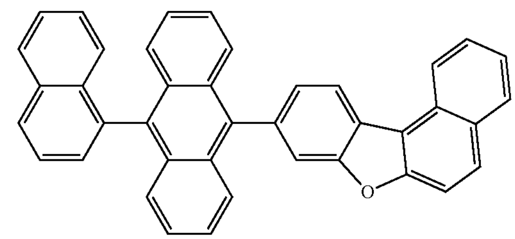

BH6

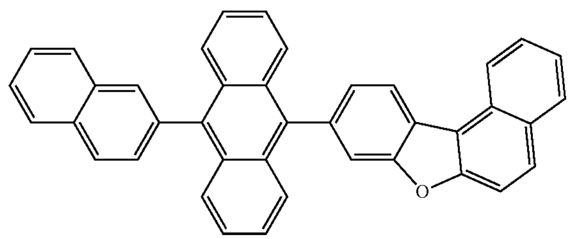

BH7

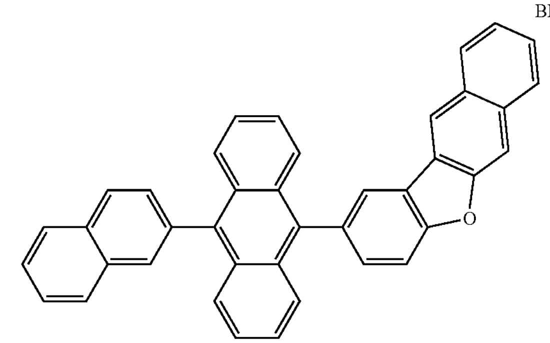

BH8

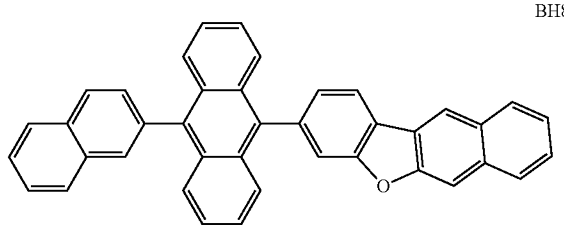

-continued
BH9
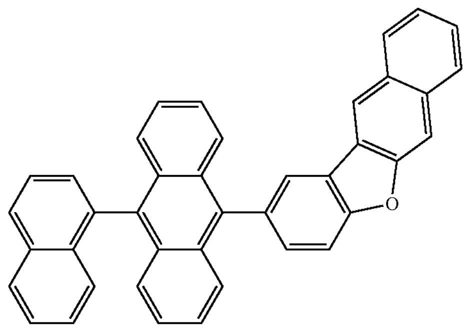
BH10
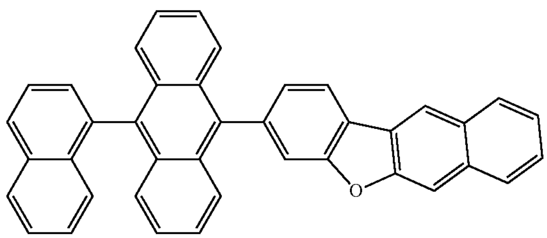
BH11
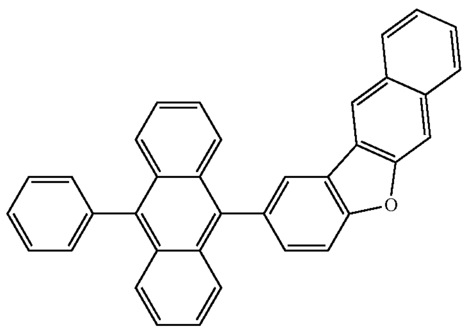
BH12
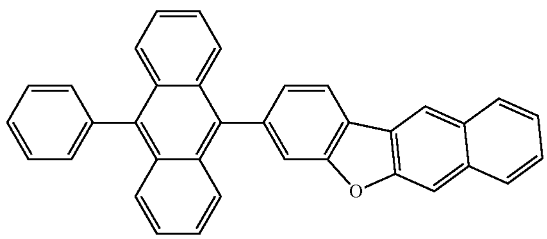
BH13
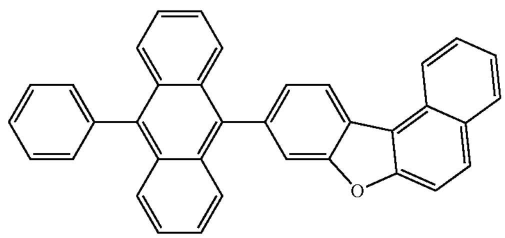
-continued
BH14
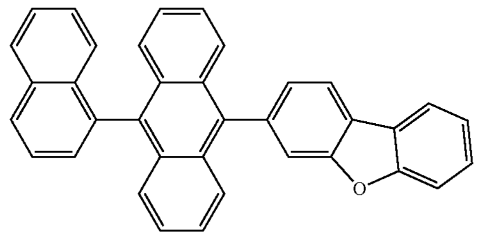
BH15
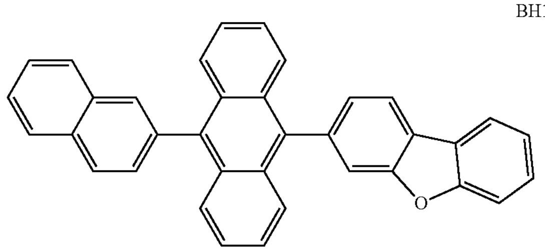
BH16
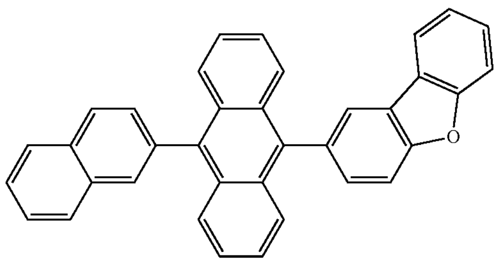
BH17
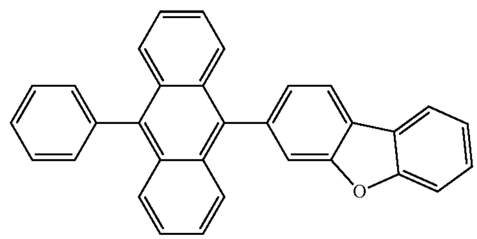
BH18
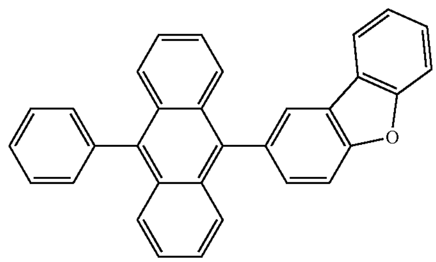
BH19
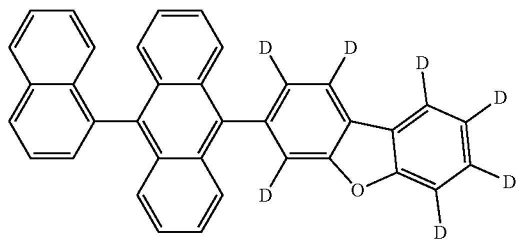

-continued
BH20
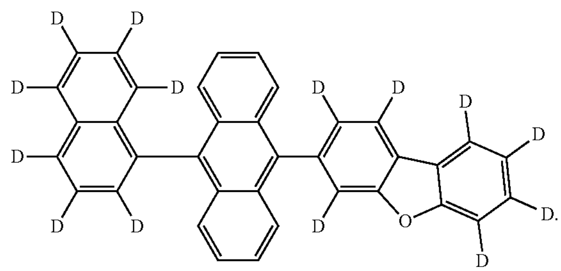
The blue light guest material may include at least one of compounds below:
B01
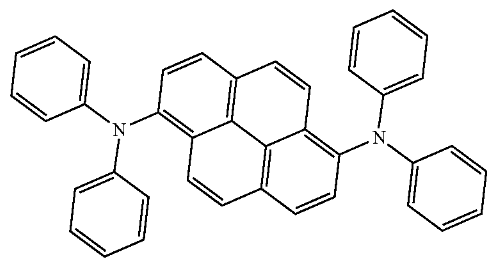
B02
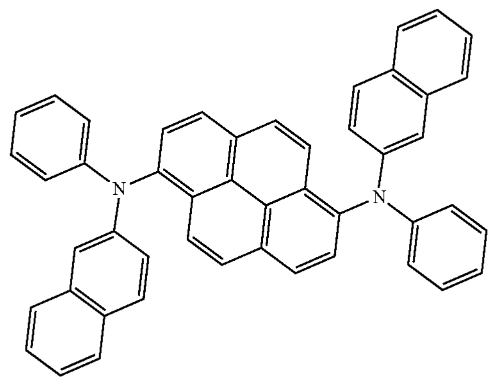
B03
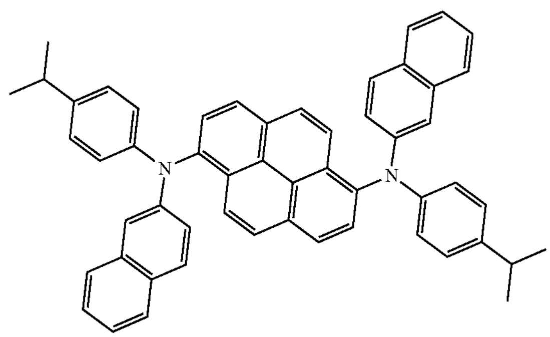
-continued
DABNA-1
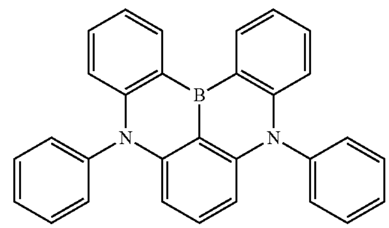
DABNA-2
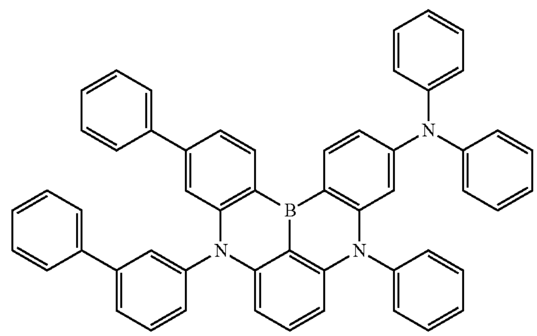
PtON-TBBI
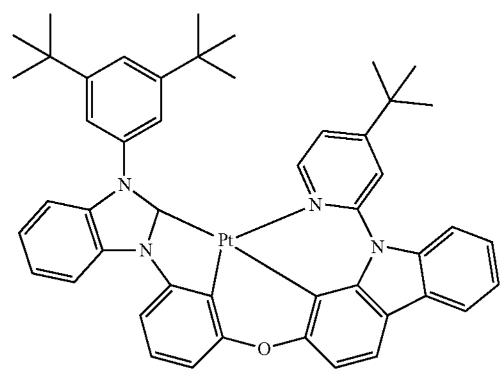
In one embodiment, electron transport materials in the first electron transport layer 181, the second electron transport layer 182, and the electron injection layer 183 may include at least one of compounds below:
Liq
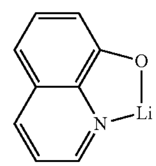
BCP
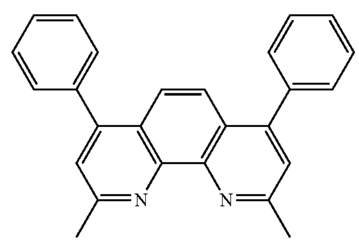

-continued
PBD
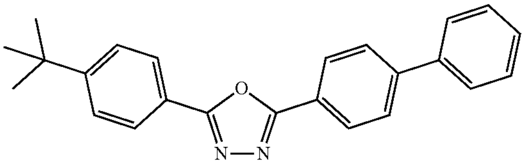
OXD-7
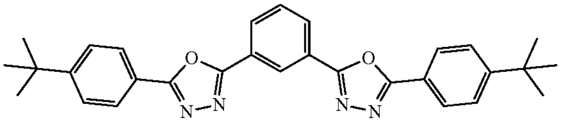
Alq
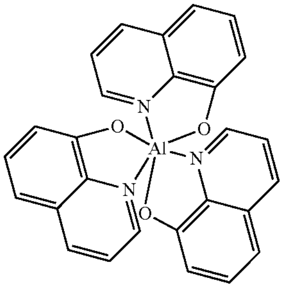
TAZ
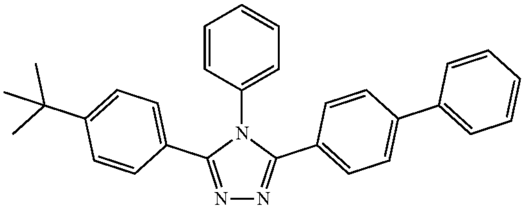
TPBI
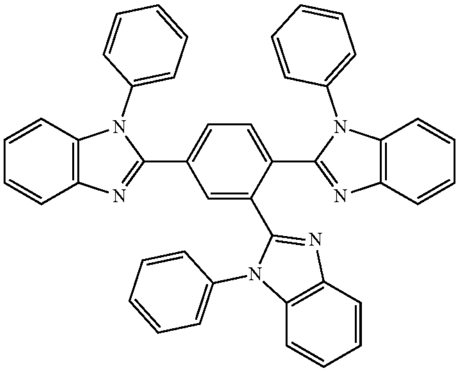
Tm3PyPB
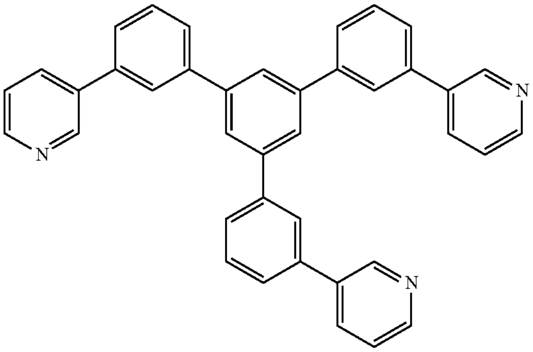
-continued
ET1
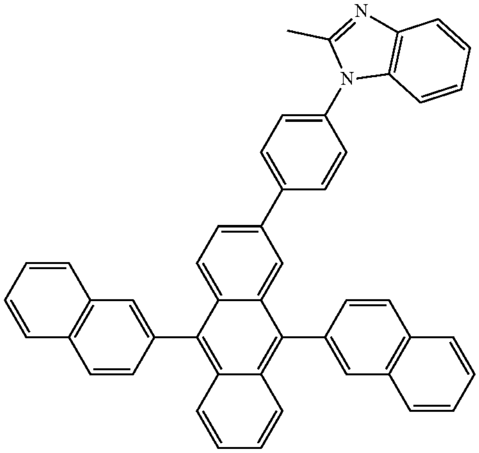
ET2
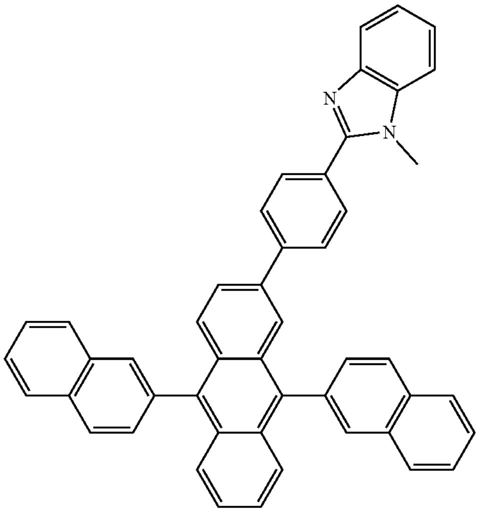
ET3
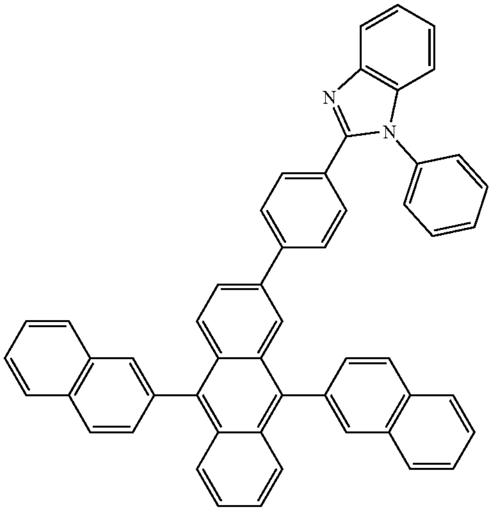

-continued
ET4
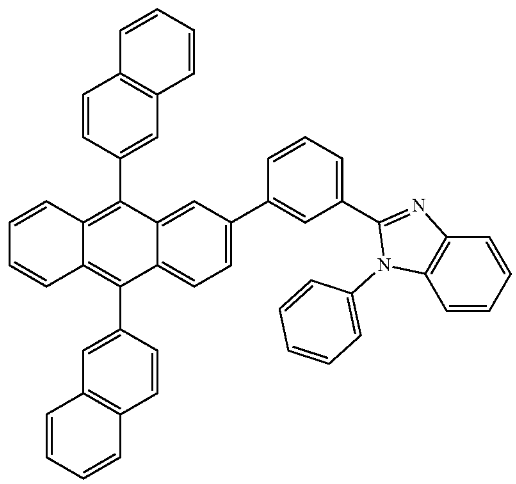
ET5
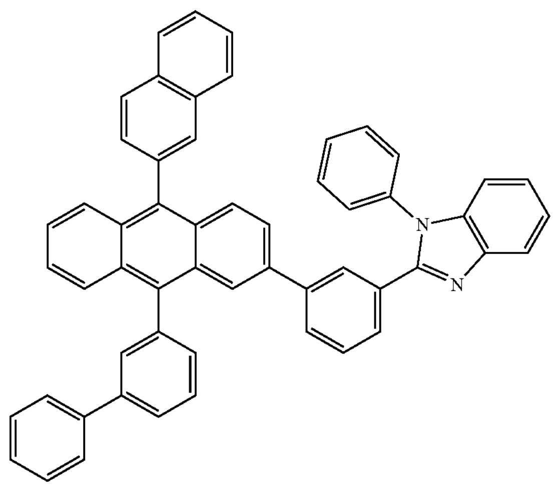
ET6
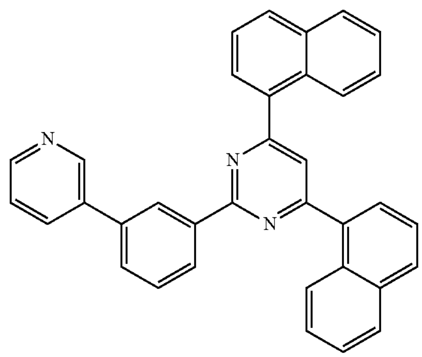
-continued
ET7
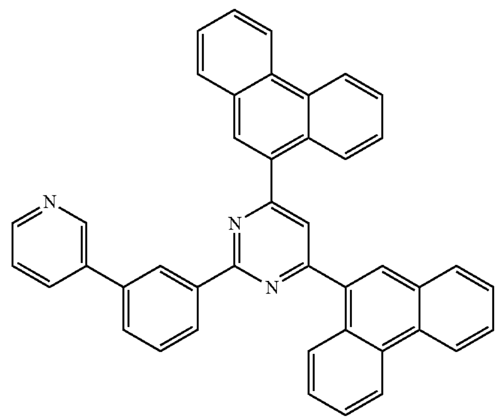
ET8
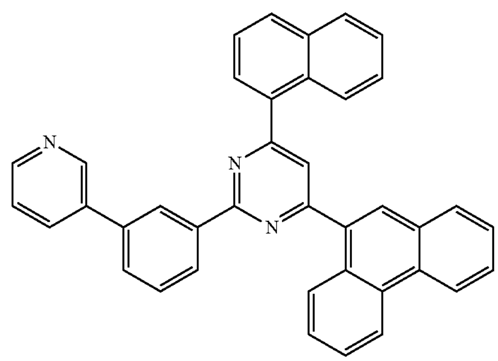
ET9
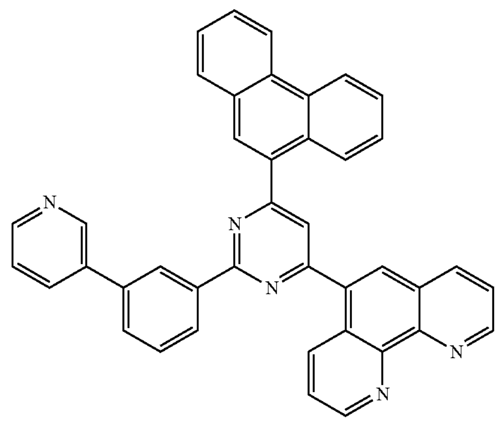
ET10
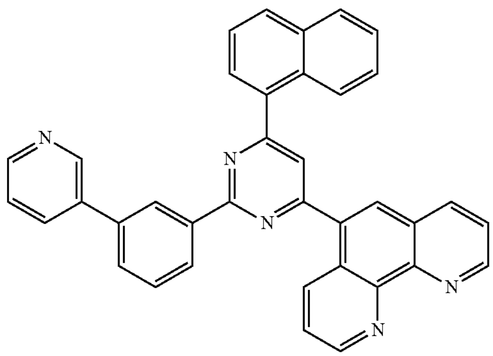

-continued
ET11
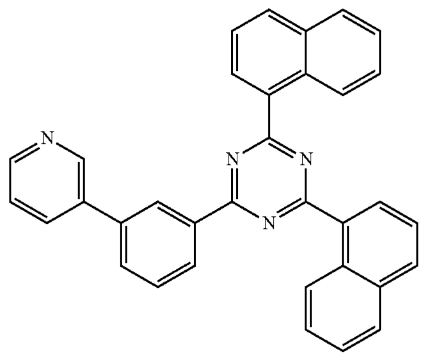
ET12
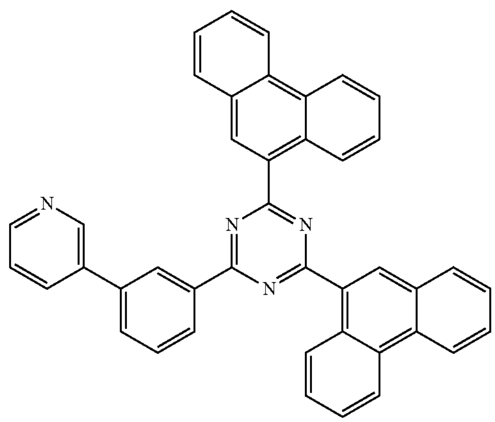
ET13
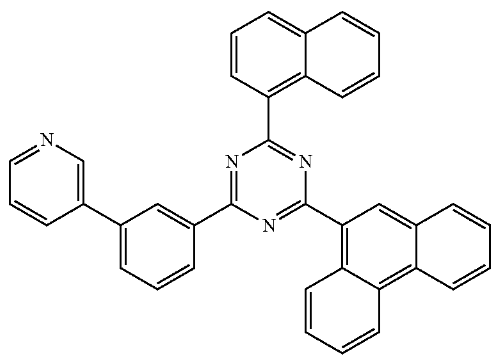
ET14
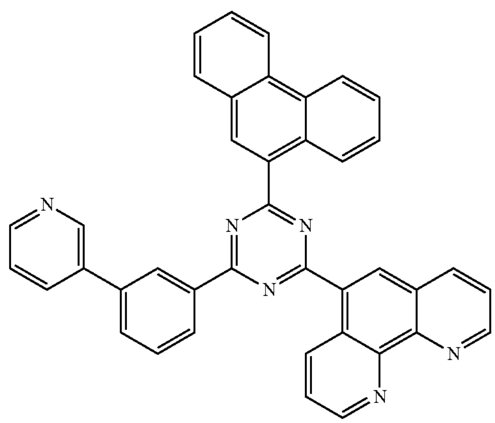
-continued
ET15
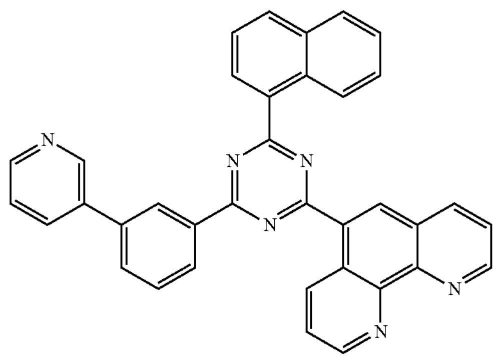
In one embodiment, the electron transport material in the n-type charge generation layer 13 may include at least one of compounds below:
E1
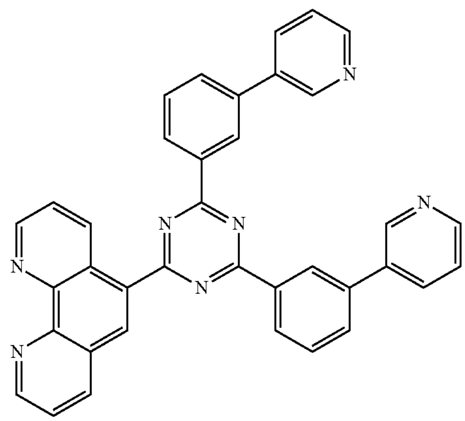
E2
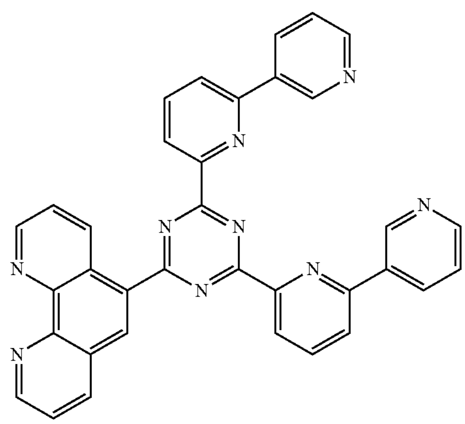

-continued
E3
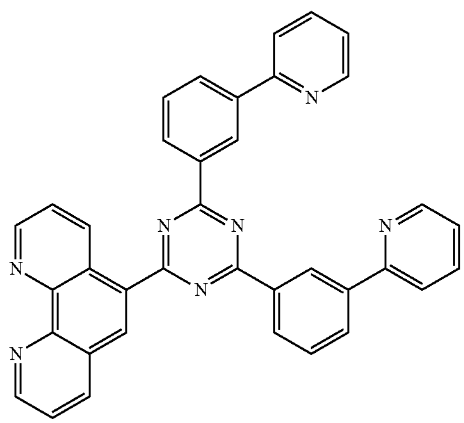
E4
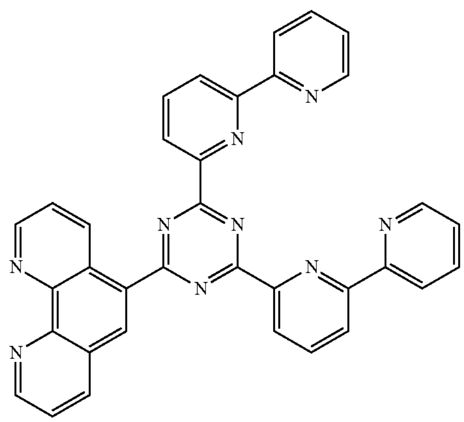
E5
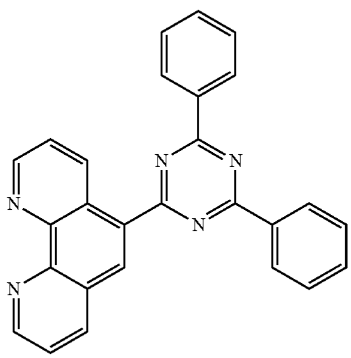
E6
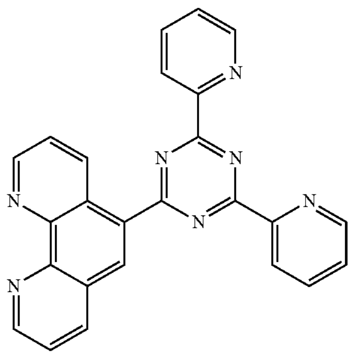
-continued
E7
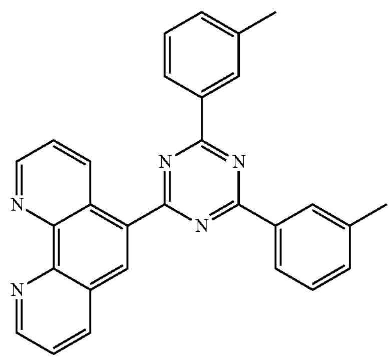
E8
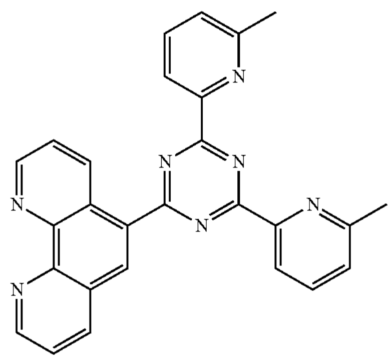
E9
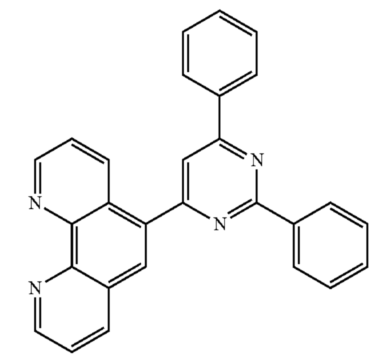
E10
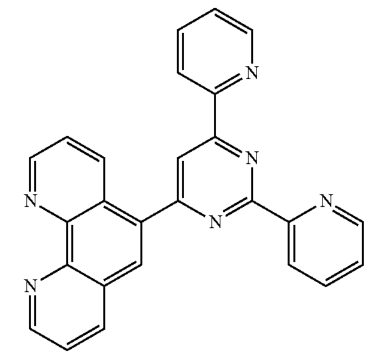

-continued
E11
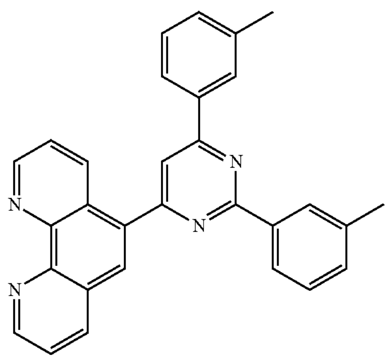
E12
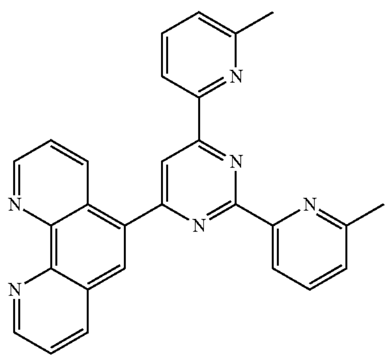
E13
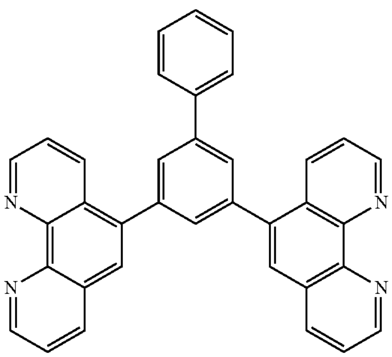
E14
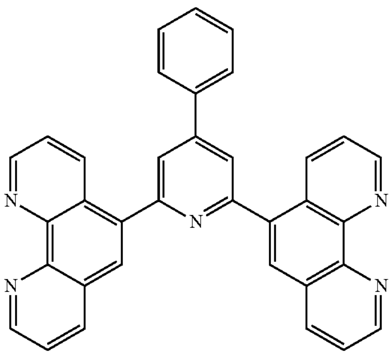
-continued
E15
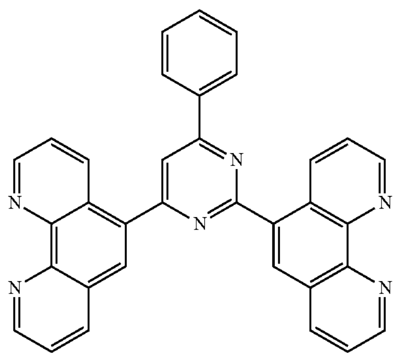
E16
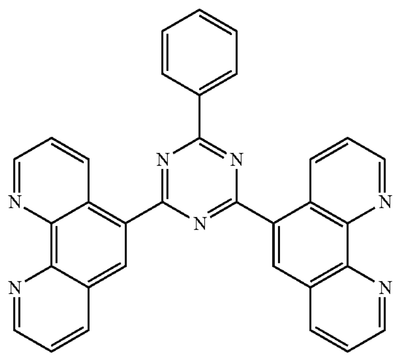
E17
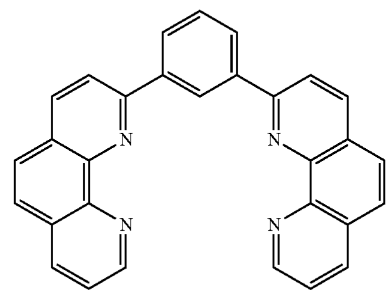
E18
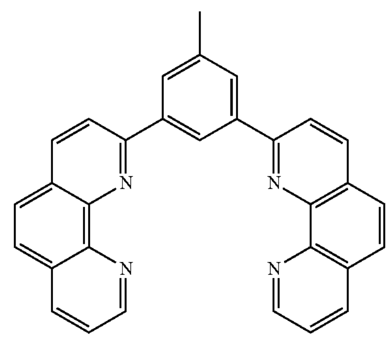
E19
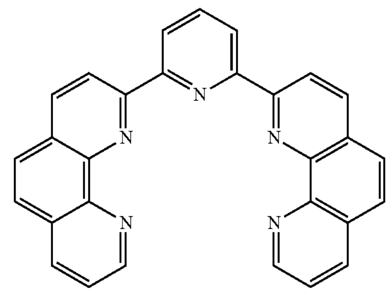

-continued
E20
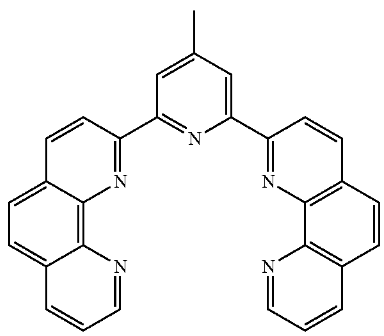
E21
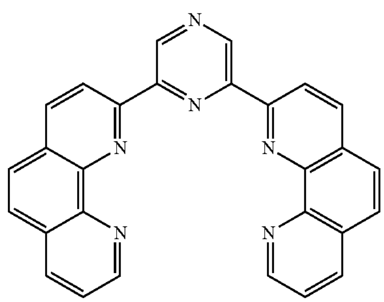
E22
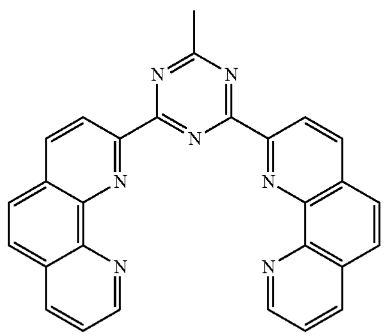
E23
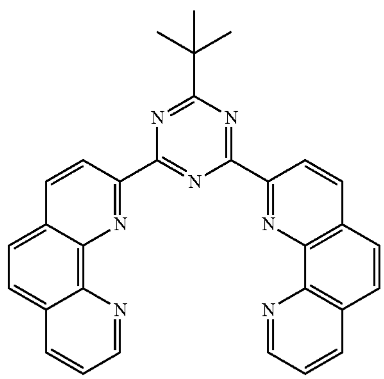
-continued
E24
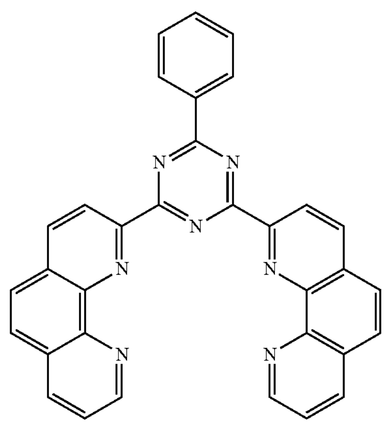
E25
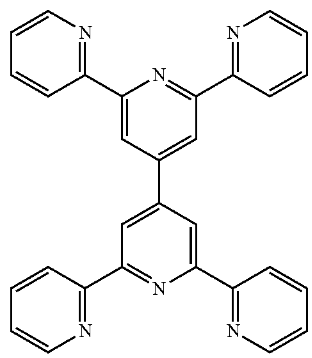
E26
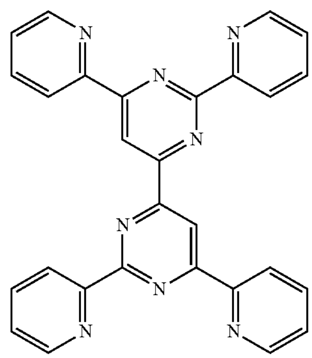
E27
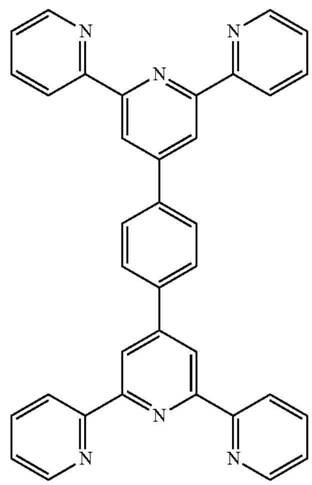

-continued

E28

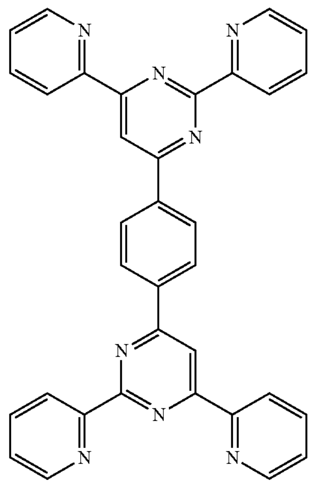

Figure 4:
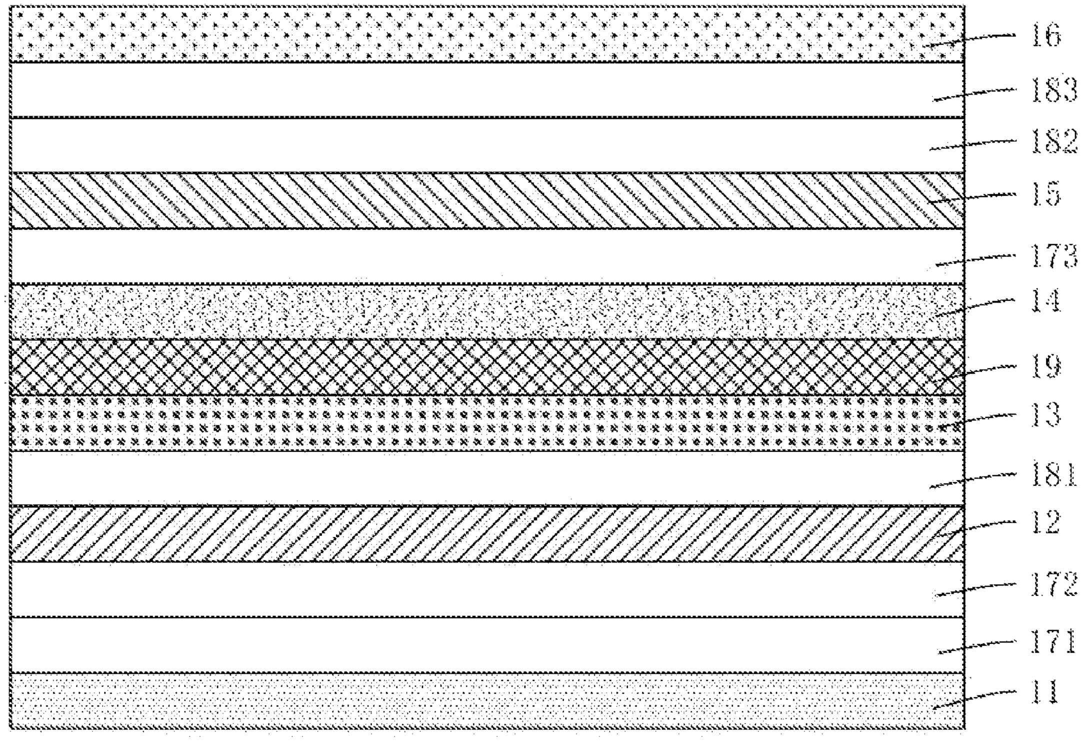
FIG. 4 is another structural schematic diagram of a light-emitting device layer in a display panel provided by the embodiment of the present application.

In another embodiment of the present application, please refer to FIG. 1 and FIG. 4, difference between this embodiment and the embodiment shown in FIG. 3 is that a buffer layer 19 is disposed between the n-type charge generation layer 13 and the p-type charge generation layer 14. The material of the buffer layer 19 may include at least one of an organic materials and a metal material. In embodiments of the present application, the buffer layer 19 may play a role in separating the n-type charge generation layer 13 and the p-type charge generation layer 14, so as to reduce reactivity between the n-type doping material 131 and the p-type doping material 141 at high temperatures.

In one embodiment, the material of the buffer layer 19 may include at least one of the materials of the hole transport layers, the materials of the electron transport layers, an organic material in the n-type charge generation layer 13, aluminum, silver, and zinc oxide.

To sum up, in the embodiments of the present application, the difference value between the second operating voltage and the first operating voltage of the light-emitting device layer 10 can be controlled to reduce reactivity between the n-type doping material 131 and the p-type doping material 141 at high temperatures. Therefore, high-temperature stability of the light-emitting device layer 10 is improved, thereby improving stability and display effect of the display panel.

Further, in order to verify effect in reducing reactivity between the n-type doping material 131 and the p-type doping material 141 at high temperatures in the embodiments of the present application, embodiments of the present application provide reactive devices to verify operating voltages under different conditions.

It can be understood that the reactive device not a functional device in the display panel, but a device provided by embodiments of the present application to verify high-temperature reactivity.

Figure 5:
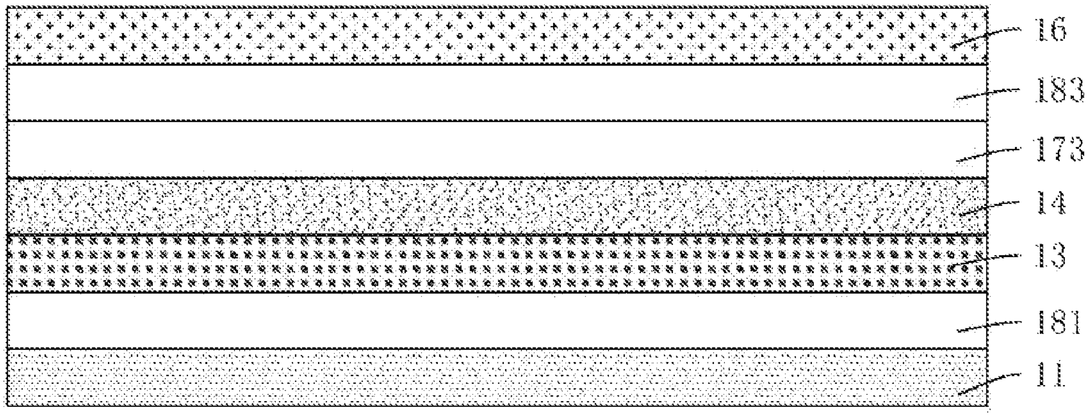
FIG. 5 is a schematic structural diagram of a reactive device provided by the embodiment of the present application.

Referring to FIG. 5, the reactive device includes the first electron transport layer 181, the n-type charge generation layer 13, the p-type charge generation layer 14, the first hole transport layer 173, the electron injection layer 183, and the cathode 16 that are sequentially disposed on the anode 11. That is, compared with the light-emitting device layer 10 shown in FIG. 3, the reactive device removes the first light-emitting layer 12, the second light-emitting layer 15, and the second electron transport layer 182, the second hole transport layer 172, and the hole injection layer 171 adjacent to the light-emitting layers.

Specifically, comparative example 1, comparative example 2, embodiment 1, and embodiment 2 are provided by embodiments of the present application.

In comparative example 1, the anode 11 is made of the material of ITO. The material of the first electron transport layer 181 includes Liq and ET5, a mass percentage content of Liq is 50%, and the thickness of the first electron transport layer 181 is 10 nm. The material of the n-type charge generation layer 13 includes Yb and E19, a mass percentage content of Yb is 5%, and the thickness of the n-type charge generation layer 13 is 10 nm. The material of the p-type charge generation layer 14 includes PD-a1 and TAPC, a mass percentage content of PD-a1 is 5%, and the thickness of the p-type charge generation layer 14 is 10 nm. The material of the first hole transport layer 173 includes TAPC, and the thickness of the first hole transport layer 173 is 10 nm. The material of the electron injection layer 183 includes Yb, and the thickness of the electron injection layer 183 is 1 nm. The material of cathode 16 includes Mg and Ag, a mass percentage content of Mg is 10%, and the thickness of cathode 16 is 20 nm.

In comparative example 2, the anode 11 is made of the material of ITO. The material of the first electron transport layer 181 includes Liq and ET5, a mass percentage content of Liq is 50%, and the thickness of the first electron transport layer 181 is 10 nm. The material of the n-type charge generation layer 13 includes Yb and E19, a mass percentage content of Yb is 5%, and the thickness of the n-type charge generation layer 13 is 10 nm. The material of the p-type charge generation layer 14 includes PD-a2 and TAPC, a mass percentage content of PD-a2 is 5%, and the thickness of the p-type charge generation layer 14 is 10 nm. The material of the first hole transport layer 173 includes TAPC, and the thickness of the first hole transport layer 173 is 10 nm. The material of the electron injection layer 183 includes Yb, and the thickness of the electron injection layer 183 is 1 nm. The material of cathode 16 includes Mg and Ag, a mass percentage content of Mg is 10%, and the thickness of cathode 16 is 20 nm.

In embodiment 1, the anode 11 is made of the material of ITO. The material of the first electron transport layer 181 includes Liq and ET5, a mass percentage content of Liq is 50%, and the thickness of the first electron transport layer 181 is 10 nm. The material of the n-type charge generation layer 13 includes Yb and E19, a mass percentage content of Yb is 5%, and the thickness of the n-type charge generation layer 13 is 10 nm. the material of the p-type charge generation layer 14 includes PD-113 and TAPC, a mass percentage content of PD-113 is 5%, and the thickness of the p-type charge generation layer 14 is 10 nm. The material of the first hole transport layer 173 includes TAPC, and the thickness of the first hole transport layer 173 is 10 nm. The material of the electron injection layer 183 includes Yb, and the thickness of the electron injection layer 183 is 1 nm. The material of cathode 16 includes Mg and Ag, a mass percentage content of Mg is 10%, and the thickness of cathode 16 is 20 nm.

In embodiment 2, the anode 11 is made of the material of ITO. The material of the first electron transport layer 181 includes Liq and ET5, a mass percentage content of Liq is 50%, and the thickness of the first electron transport layer 181 is 10 nm. The material of the n-type charge generation layer 13 includes Yb and E19, a mass percentage content of Yb is 5%, and the thickness of the n-type charge generation layer 13 is 10 nm. The material of the p-type charge generation layer 14 includes PD-114 and TAPC, a mass percentage content of PD-114 is 5%, and the thickness of the p-type charge generation layer 14 is 10 nm. The material of the first hole transport layer 173 includes TAPC, and the thickness of the first hole transport layer 173 is 10 nm. The material of the electron injection layer 183 includes Yb, and the thickness of the electron injection layer 183 is 1 nm. The material of cathode 16 includes Mg and Ag, a mass percentage content of Mg is 10%, and the thickness of cathode 16 is 20 nm.

Structural formulas of PD-a1 and PD-a2 are as follows:

PD-a1

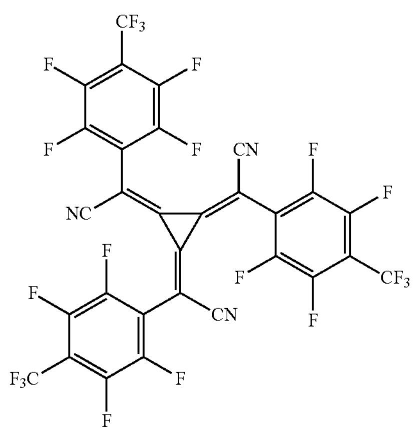

PD-a2

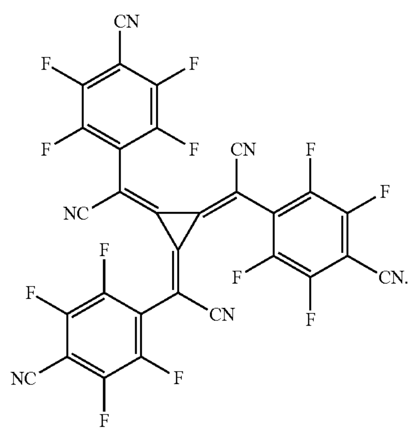

Under high vacuum conditions, the reactive devices shown in comparative example 1, comparative example 2, embodiment 1, and embodiment 2 are formed, respectively. The specific test verification process includes:

First, a first operating voltage V1 of the reactive device at a current density of 10 mA/cm$^2$ is measured under normal temperature condition; and then, a second operating voltage V2 is measured after continuous operation at 110° C. and the current density of 10 mA/cm$^2$ for 120 hours. There is a positive correlation between ΔV (V2-V1) and reactivity between the n-type doping material 131 and the p-type doping material 141 at high temperatures. Data obtained are shown in Table 1 below.

TABLE 1 data table of operating voltages

| | condition | V (V) | ΔV (V) |
|---|---|---|---|
| comparative example 1 | $V_1$ | 6.8 | 7.8 |
| | $V_2$ | 14.6 | |
| comparative example 2 | $V_1$ | 7.3 | 8.5 |
| | $V_2$ | 15.8 | |
| embodiment 1 | $V_1$ | 7.4 | 1.9 |
| | $V_2$ | 9.3 | |
| embodiment 2 | $V_1$ | 7.8 | 2.4 |
| | $V_2$ | 10.2 | |

As can be seen from the above Table 1, compared with the comparative examples, embodiment 1 and embodiment 2 adopt materials PD-113 and PD114 of the p-type charge generation layer 14 provided by the embodiments of the present application, ΔV is significantly reduced and is less than or equal to 3V. That is, the difference value between the second operating voltage and the first operating voltage decreases, thereby indicating that reactivity between the n-type doping material 131 and the p-type doping material 141 at high temperatures in embodiment 1 and embodiment 2 can be effectively reduced.

Figure 6:
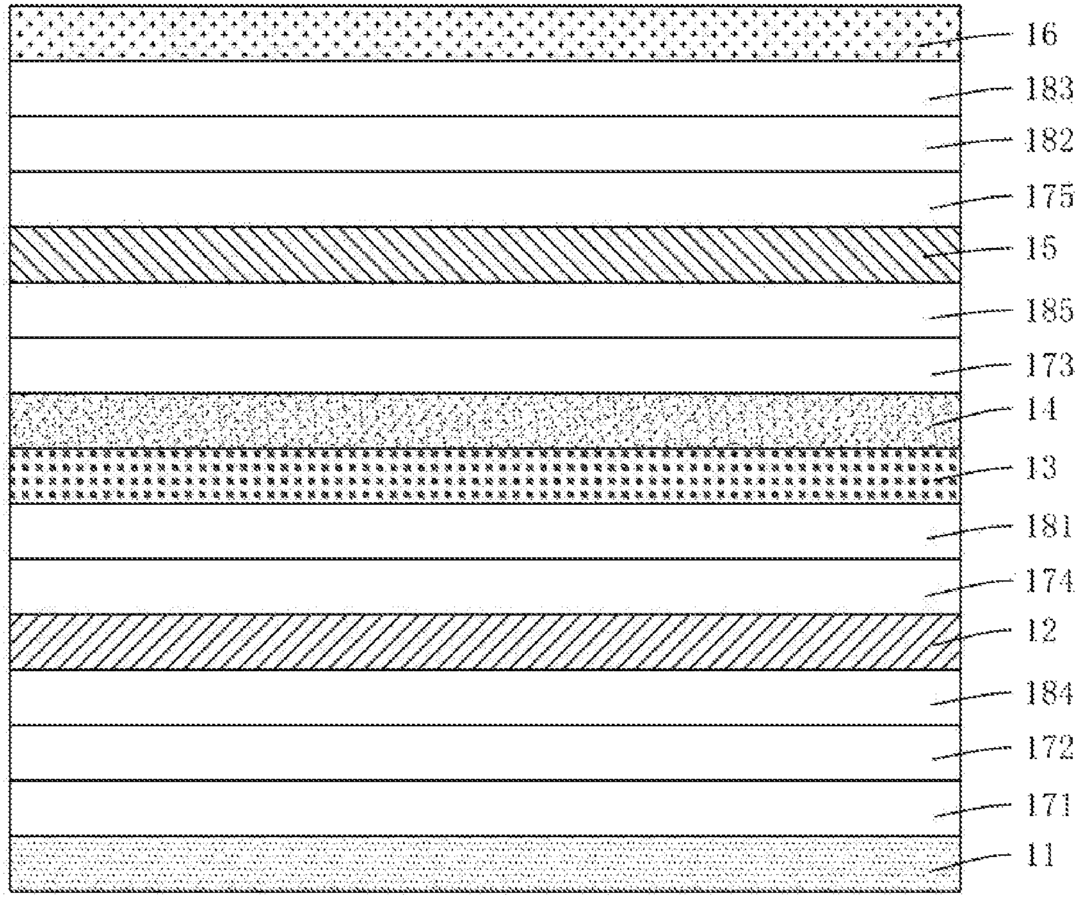
FIG. 6 is another structural schematic diagram of a light-emitting device layer in a display panel provided by the embodiment of the present application.

Further, embodiments of the present application further provide comparative example 3, comparative example 4, embodiment 3, and embodiment 4 to verify effect of reducing reactivity between the n-type doping material 131 and the p-type doping material 141 at high temperatures in a case the above materials are applied to the light-emitting device layer shown in FIG. 6.

In comparative example 3, the anode 11 is made of ITO. The material of the hole injection layer 171 includes PD-a2 and TAPC, and a mass percentage content of PD-a2 is 3%, and the thickness of the hole injection layer 171 is 10 nm. The material of the second hole transport layer 172 includes TAPC, and the thickness of the second hole transport layer 172 is 25 nm. The material of a first electron blocking layer 184 includes TCTA, and the thickness of the first electron blocking layer 184 is 5 nm. The material of the first light-emitting layer 12 includes BD3 and BH16, and a mass percentage content of BD3 is 2%, and the thickness of the first light-emitting layer 12 is 20 nm. The material of a first hole blocking layer 174 includes ET6, and the thickness of the first hole blocking layer 174 is 5 nm. The material of the first electron transport layer 181 includes Liq and ET5, a mass percentage content of Liq is 50%, and the thickness of the first electron transport layer 181 is 20 nm. The material of the n-type charge generation layer 13 includes Yb and E19, a mass percentage content of Yb is 5%, and the thickness of the n-type charge generation layer 13 is 10 nm. The material of the p-type charge generation layer 14 includes PD-a1 and TAPC, a mass percentage content of PD-a1 is 5%, and the thickness of the p-type charge generation layer 14 is 10 nm. The material of the first hole transport layer 173 includes TAPC, and the thickness of the first hole transport layer 173 is 30 nm. The material of a second electron blocking layer 185 includes TCTA, and the thickness of the second electron blocking layer 185 is 5 nm. The material of the second light-emitting layer 15 includes BD3 and BH16, a mass percentage content of BD3 is 2%, and the thickness of the second light-emitting layer 15 is 20 nm. The material of the second hole blocking layer 175 includes ET6, and the thickness of the second hole blocking layer 175 is 5 nm. The material of the second electron transport layer 182 includes Liq and ET5, a mass percentage content of Liq is 50%, and the thickness of the second electron transport layer 182 is 30 nm. The material of the electron injection layer 183 includes Yb, and the thickness of the electron injection layer 183 is 1 nm. The material of the cathode 16 includes Mg and Ag, a mass percentage content of Mg is 10%, and the thickness of the cathode 16 is 15 nm.

In comparative example 4, the anode 11 is made of ITO. The material of the hole injection layer 171 includes PD-a2 and TAPC, the mass percentage content of PD-a2 is 3%, and the thickness of the hole injection layer 171 is 10 nm. The material of the second hole transport layer 172 includes TAPC, and the thickness of the second hole transport layer 172 is 25 nm. The material of the first electron blocking layer 184 includes TCTA, and the thickness of the first electron blocking layer 184 is 5 nm. The material of the first light-emitting layer 12 include BD3 and BH16, and the mass percentage content of BD3 is 2%, and the thickness of the first light-emitting layer 12 is 20 nm. The material of the first hole blocking layer 174 includes ET6, and the thickness of the first hole blocking layer 174 is 5 nm. The material of the first electron transport layer 181 includes Liq and ET5, the mass percentage content of Liq is 50%, and the thickness of the first electron transport layer 181 is 20 nm. The material of the n-type charge generation layer 13 includes Yb and E19, the mass percentage content of Yb is 5%, and the thickness of the n-type charge generation layer 13 is 10 nm. The material of the p-type charge generation layer 14 includes PD-a2 and TAPC, a mass percentage content of PD-a2 is 5%, and the thickness of the p-type charge generation layer 14 is 10 nm. The material of the first hole transport layer 173 includes TAPC, and the thickness of the first hole transport layer 173 is 30 nm. The material of the second electron blocking layer 185 includes TCTA, and the thickness of the second electron blocking layer 185 is 5 nm. The material of the second light-emitting layer 15 includes BD3 and BH16, the mass percentage content of BD3 is 2%, and the thickness of the second light-emitting layer 15 is 20 nm. The material of the second hole blocking layer 175 includes ET6, and the thickness of the second hole blocking layer 175 is 5 nm. The material of the second electron transport layer 182 includes Liq and ET5, the mass percentage content of Liq is 50%, and the thickness of the second electron transport layer 182 is 30 nm. The material of the electron injection layer 183 includes Yb, and the thickness of the electron injection layer 183 is 1 nm. The material of the cathode 16 includes Mg and Ag, the mass percentage content of Mg is 10%, and the thickness of the cathode 16 is 15 nm.

In embodiment 3, the anode 11 is made of ITO. The material of the hole injection layer 171 includes PD-a2 and TAPC, the mass percentage content of PD-a2 is 3%, and the thickness of the hole injection layer 171 is 10 nm. The material of the second hole transport layer 172 includes TAPC, and the thickness of the second hole transport layer 172 is 25 nm. The material of the first electron blocking layer 184 includes TCTA, and the thickness of the first electron blocking layer 184 is 5 nm. The material of the first light-emitting layer 12 include BD3 and BH16, and the mass percentage content of BD3 is 2%, and the thickness of the first light-emitting layer 12 is 20 nm. The material of the first hole blocking layer 174 includes ET6, and the thickness of the first hole blocking layer 174 is 5 nm. The material of the first electron transport layer 181 includes Liq and ET5, the mass percentage content of Liq is 50%, and the thickness of the first electron transport layer 181 is 20 nm. The material of the n-type charge generation layer 13 includes Yb and E19, the mass percentage content of Yb is 5%, and the thickness of the n-type charge generation layer 13 is 10 nm. The material of the p-type charge generation layer 14 includes PD-113 and TAPC, a mass percentage content of PD-113 is 5%, and the thickness of the p-type charge generation layer 14 is 10 nm. The material of the first hole transport layer 173 includes TAPC, and the thickness of the first hole transport layer 173 is 30 nm. The material of the second electron blocking layer 185 includes TCTA, and the thickness of the second electron blocking layer 185 is 5 nm. The material of the second light-emitting layer 15 includes BD3 and BH16, the mass percentage content of BD3 is 2%, and the thickness of the second light-emitting layer 15 is 20 nm. The material of the second hole blocking layer 175 includes ET6, and the thickness of the second hole blocking layer 175 is 5 nm. The material of the second electron transport layer 182 includes Liq and ET5, the mass percentage content of Liq is 50%, and the thickness of the second electron transport layer 182 is 30 nm. The material of the electron injection layer 183 includes Yb, and the thickness of the electron injection layer 183 is 1 nm. The material of the cathode 16 includes Mg and Ag, the mass percentage content of Mg is 10%, and the thickness of the cathode 16 is 15 nm.

In embodiment 4, the anode 11 is made of ITO. The material of the hole injection layer 171 includes PD-a2 and TAPC, the mass percentage content of PD-a2 is 3%, and the thickness of the hole injection layer 171 is 10 nm. The material of the second hole transport layer 172 includes TAPC, and the thickness of the second hole transport layer 172 is 25 nm. The material of the first electron blocking layer 184 includes TCTA, and the thickness of the first electron blocking layer 184 is 5 nm. The material of the first light-emitting layer 12 include BD3 and BH16, and the mass percentage content of BD3 is 2%, and the thickness of the first light-emitting layer 12 is 20 nm. The material of the first hole blocking layer 174 includes ET6, and the thickness of the first hole blocking layer 174 is 5 nm. The material of the first electron transport layer 181 includes Liq and ET5, the mass percentage content of Liq is 50%, and the thickness of the first electron transport layer 181 is 20 nm. The material of the n-type charge generation layer 13 includes Yb and E19, the mass percentage content of Yb is 5%, and the thickness of the n-type charge generation layer 13 is 10 nm. The material of the p-type charge generation layer 14 includes PD-114 and TAPC, a mass percentage content of PD-114 is 5%, and the thickness of the p-type charge generation layer 14 is 10 nm. The material of the first hole transport layer 173 includes TAPC, and the thickness of the first hole transport layer 173 is 30 nm. The material of the second electron blocking layer 185 includes TCTA, and the thickness of the second electron blocking layer 185 is 5 nm. The material of the second light-emitting layer 15 includes BD3 and BH16, the mass percentage content of BD3 is 2%, and the thickness of the second light-emitting layer 15 is 20 nm. The material of the second hole blocking layer 175 includes ET6, and the thickness of the second hole blocking layer 175 is 5 nm. The material of the second electron transport layer 182 includes Liq and ET5, the mass percentage content of Liq is 50%, and the thickness of the second electron transport layer 182 is 30 nm. The material of the electron injection layer 183 includes Yb, and the thickness of the electron injection layer 183 is 1 nm. The material of the cathode 16 includes Mg and Ag, the mass percentage content of Mg is 10%, and the thickness of the cathode 16 is 15 nm.

Under high vacuum conditions, the reactive devices shown in comparative example 3, comparative example 4, embodiment 3, and embodiment 4 are formed, respectively. The specific test verification process includes:

First, a first operating voltage V1 of the reactive device at a current density of 10 mA/$cm^2$ is measured under normal temperature condition; and then, a second operating voltage V2 (that is, the maximum operating voltage Vmax during continuous operation) is measured after continuous operation at 110° C. and the current density of 10 mA/$cm^2$ for 120 hours. There is a positive correlation between ΔV (V2-V1) and reactivity between the n-type doping material 131 and the p-type doping material 141 at high temperatures. Data obtained are shown in Table 2 below.

TABLE 2 data table of operating voltages

| | ΔV (V) |
|---|---|
| comparative example 3 | 5.0 |
| comparative example 4 | 4.0 |
| embodiment 3 | 0.3 |
| embodiment 4 | 0.4 |

As can be seen from the above Table 2, compared with the comparative examples, embodiment 3 and embodiment 4 adopt materials PD-113 and PD114 of the p-type charge generation layer 14 provided by the embodiments of the present application, ΔV is significantly reduced and is less than or equal to 0.5V. That is, the difference value between the second operating voltage and the first operating voltage decreases, thereby indicating that reactivity between the n-type doping material 131 and the p-type doping material 141 at high temperatures in example 3 and example 4 can be effectively reduced.

In addition, an embodiment of the present application further provide a display device including the display panel described in the above embodiments.

In one embodiment, the display device may include display such as mobile, vehicle, AR/VR, notebook, monitor, and TV.

It can be understood that since the display device includes the display panel described in the above embodiments, the display device has the same beneficial effects as the display panel described in the above embodiment, and the beneficial effects are not described again here.

In the above embodiments, each embodiment is described with its own emphasis. For parts that are not described in detail in a certain embodiment, please refer to relevant descriptions of other embodiments.

The above is a detailed introduction to a display panel and a display device provided by the embodiments of the present application. Specific examples are used in this article to illustrate principles and implementation methods of the present application. The description of the above embodiments is only used to help understand technical solutions and core ideas of the present application. Those of ordinary skill in the art should understand that they can still modify the technical solutions recorded in the foregoing embodiments, or make equivalent substitutions for some of the technical features. These modifications or substitutions do not cause the essence of the corresponding technical solution to depart from the scope of the technical solution of each embodiment of the present application.

What is claimed is:

1. A display panel, comprising a light-emitting device layer, wherein the light-emitting device layer comprises:

an anode;

a first light-emitting layer disposed on a side of the anode;

an n-type charge generation layer disposed on a side of the first light-emitting layer away from the anode and comprising an electron transport material and an n-type doping material;

a p-type charge generation layer disposed on a side of the n-type charge generation layer away from the first light-emitting layer and comprising a hole transport material and a p-type doping material;

a second light-emitting layer disposed on a side of the p-type charge generation layer away from the n-type charge generation layer; and a cathode disposed on a side of the second light-emitting layer away from the p-type charge generation layer;

wherein the light-emitting device layer has a first operating voltage to operate at a preset current density, and has a second operating voltage after operating at the preset current density and a first preset temperature for a preset time; the absolute value of a difference value between the first operating voltage and the second operating voltage is a1, and a1 is less than or equal to 1V; and the first preset temperature is greater than or equal to 50° C.

2. The display panel according to claim 1, wherein the light-emitting device layer has a third operating voltage after operating at the preset current density and a second preset temperature for the preset time, and the absolute value of a difference value between the first operating voltage and the third operating voltage is a2, a2 is less than a1, and the second preset temperature is less than 50° C.

3. The display panel according to claim 2, wherein the second operating voltage is greater than the first operating voltage, and the third operating voltage is greater than the first operating voltage.

4. The display panel according to claim 2, wherein the preset time is greater than 0 hours and less than or equal to 120 hours, and the preset current density is greater than or equal to 5 mA/$cm^2$.

5. The display panel according to claim 1, wherein the absolute value of the difference value between the second operating voltage and the first operating voltage is less than or equal to 0.5V.

6. The display panel according to claim 1, wherein the absolute value of the difference value between the second operating voltage and the first operating voltage decreases as a doping concentration of the p-type doping material in the p-type charge generation layer decreases.

7. The display panel according to claim 6, wherein the light-emitting device layer further comprises a hole injection layer disposed between the anode and the first light-emitting layer, the hole injection layer is distributed with a first doping material, and the first doping material is different from the p-type doping material.

8. The display panel according to claim 6, wherein the light-emitting device layer further comprises a hole injection layer disposed between the anode and the first light-emitting layer, and the hole injection layer is distributed with a first doping material; the first doping material is the same as the p-type doping material, and a doping concentration of the first doping material in the hole injection layer is different from a doping concentration of the p-type doping material in the p-type charge generation layer.

9. The display panel according to claim 6, wherein a mass percentage content of the p-type doping material in the p-type charge generation layer is greater than or equal to 0.1% and less than or equal to 20%.

10. The display panel according to claim 6, wherein the light-emitting device layer further comprises a first hole transport layer disposed between the p-type charge generation layer and the second light-emitting layer, a lowest unoccupied orbital energy level of the p-type doping material is greater than −5.5 eV, and a highest occupied orbital energy level of a material of the first hole transport layer is greater than −6.5 eV.

11. The display panel according to claim 10, wherein a difference value between the lowest unoccupied orbital energy level of the p-type doping material and the highest occupied orbital energy level of the material of the first hole transport layer is less than 1 eV.

12. The display panel according to claim 6, wherein a reddest absorption peak wavelength of the p-type doping material is greater than 400 nm, and a fluorescence emission peak wavelength of the p-type doping material is greater than 500 nm.

13. The display panel according to claim 1, wherein the light-emitting device layer further comprises a buffer layer disposed between the n-type charge generation layer and the p-type charge generation layer and comprising at least one of an organic material and a metal material.

14. A display device, comprising a display panel, the display panel comprising a light-emitting device layer, wherein the light-emitting device layer comprises:

an anode;

a first light-emitting layer disposed on a side of the anode;

an n-type charge generation layer disposed on a side of the first light-emitting layer away from the anode and comprising an electron transport material and an n-type doping material;

a p-type charge generation layer disposed on a side of the n-type charge generation layer away from the first light-emitting layer and comprising a hole transport material and a p-type doping material;

a second light-emitting layer disposed on a side of the p-type charge generation layer away from the n-type charge generation layer; and a cathode disposed on a side of the second light-emitting layer away from the p-type charge generation layer;

wherein the light-emitting device layer has a first operating voltage to operate at a preset current density, and has a second operating voltage after operating at the preset current density and a first preset temperature for a preset time; the absolute value of a difference value between the first operating voltage and the second operating voltage is a1, and a1 is less than or equal to 1V; and the first preset temperature is greater than or equal to 50° C.

15. The display device according to claim 14, wherein the light-emitting device layer has a third operating voltage after operating at the preset current density and a second preset temperature for the preset time, and the absolute value of a difference value between the first operating voltage and the third operating voltage is a2, a2 is less than a1, and the second preset temperature is less than 50° C.

16. The display device according to claim 15, wherein the second operating voltage is greater than the first operating voltage, and the third operating voltage is greater than the first operating voltage.

17. The display device according to claim 15, wherein the preset time is greater than 0 hours and less than or equal to 120 hours, and the preset current density is greater than or equal to 5 $mA/cm^2$.

18. The display device according to claim 14, wherein the absolute value of the difference value between the second operating voltage and the first operating voltage is less than or equal to 0.5V.

19. The display device according to claim 14, wherein the absolute value of the difference value between the second operating voltage and the first operating voltage decreases as a doping concentration of the p-type doping material in the p-type charge generation layer decreases.

20. The display device according to claim 19, wherein a mass percentage content of the p-type doping material in the p-type charge generation layer is greater than or equal to 0.1% and less than or equal to 20%.

* * * * *